(12) United States Patent
Guillorn et al.

(10) Patent No.: US 10,134,905 B2
(45) Date of Patent: Nov. 20, 2018

(54) SEMICONDUCTOR DEVICE INCLUDING WRAP AROUND CONTACT, AND METHOD OF FORMING THE SEMICONDUCTOR DEVICE

(71) Applicant: International Business Machines Corporation, Armonk, NY (US)

(72) Inventors: Michael A. Guillorn, Cold Springs, NY (US); Nicolas Jean Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/199,334

(22) Filed: Jun. 30, 2016

(65) Prior Publication Data
US 2018/0006159 A1    Jan. 4, 2018

(51) Int. Cl.
| | |
|---|---|
| *H01L 29/06* | (2006.01) |
| *H01L 29/786* | (2006.01) |
| *H01L 29/423* | (2006.01) |
| *H01L 21/768* | (2006.01) |
| *H01L 23/535* | (2006.01) |
| *H01L 23/532* | (2006.01) |
| *H01L 29/66* | (2006.01) |

(52) U.S. Cl.
CPC .. *H01L 29/78618* (2013.01); *H01L 21/76805* (2013.01); *H01L 21/76843* (2013.01); *H01L 21/76889* (2013.01); *H01L 21/76895* (2013.01); *H01L 23/535* (2013.01); *H01L 23/53266* (2013.01); *H01L 29/0673* (2013.01); *H01L 29/42392* (2013.01); *H01L 29/66545* (2013.01); *H01L 29/66772* (2013.01); *H01L 29/78654* (2013.01); *H01L 29/78696* (2013.01)

(58) Field of Classification Search
None
See application file for complete search history.

(56) References Cited

U.S. PATENT DOCUMENTS

| | | |
|---|---|---|
| 7,893,492 B2 | 2/2011 | Bedell et al. |
| 8,084,308 B2 | 12/2011 | Chang et al. |
| 8,362,574 B2 | 1/2013 | Kawasaki et al. |
| 8,679,902 B1 | 3/2014 | Basker et al. |

(Continued)

FOREIGN PATENT DOCUMENTS

| | | |
|---|---|---|
| CN | 102668093 A | 9/2012 |
| CN | 104813477 A | 7/2015 |

OTHER PUBLICATIONS

M. A. Bergendahl et al., "Forming Stacked Nanowire Semiconductor Device," U.S. Appl. No. 15/008,615, filed Jan. 28, 2016.
International Search Report dated Oct. 17, 2017.

*Primary Examiner* — Alexander Ghyka
(74) *Attorney, Agent, or Firm* — Vazken Alexanian; McGinn IP Law Group, PLLC

(57) ABSTRACT

A method of forming a wrap around contact, includes forming a plurality of semiconductor layers on a plurality of fin structures, forming a sacrificial gate on the plurality of semiconductor layers, forming an epitaxial layer on the plurality of fin structures and on a sidewall of the plurality of semiconductor layers, forming a gate structure by replacing the sacrificial gate and the plurality of semiconductor layers with a metal layer, and forming a wrap around contact on the epitaxial layer.

23 Claims, 28 Drawing Sheets

(56) References Cited

U.S. PATENT DOCUMENTS

| | | |
|---|---|---|
| 8,890,116 B2 | 11/2014 | Chen et al. |
| 8,896,101 B2 | 11/2014 | Then et al. |
| 8,901,655 B2 | 12/2014 | Chang et al. |
| 9,123,567 B2 | 9/2015 | Radosavljevic et al. |
| 9,129,829 B2 | 9/2015 | Kuhn et al. |
| 9,318,581 B1 | 4/2016 | Guo et al. |
| 9,373,693 B2 | 6/2016 | Then et al. |
| 2006/0134916 A1 | 6/2006 | Prince et al. |
| 2011/0147840 A1 | 6/2011 | Cea et al. |
| 2014/0084371 A1 | 3/2014 | Basker et al. |
| 2014/0175515 A1 | 6/2014 | Then et al. |
| 2014/0273360 A1 | 9/2014 | Wei et al. |
| 2014/0273369 A1* | 9/2014 | Wei ................ H01L 21/82382 438/232 |
| 2015/0064859 A1 | 3/2015 | Then et al. |
| 2015/0069328 A1 | 3/2015 | Leobandung |
| 2015/0200260 A1 | 7/2015 | Yu et al. |
| 2015/0236120 A1 | 8/2015 | Hashemi et al. |
| 2015/0372104 A1 | 12/2015 | Liu et al. |
| 2016/0064512 A1* | 3/2016 | Then ................ H01L 29/66431 438/172 |
| 2016/0079422 A1* | 3/2016 | Rachmady ........ H01L 29/42392 257/29 |
| 2016/0087041 A1 | 3/2016 | Ching et al. |
| 2016/0293774 A1 | 10/2016 | Then et al. |

\* cited by examiner

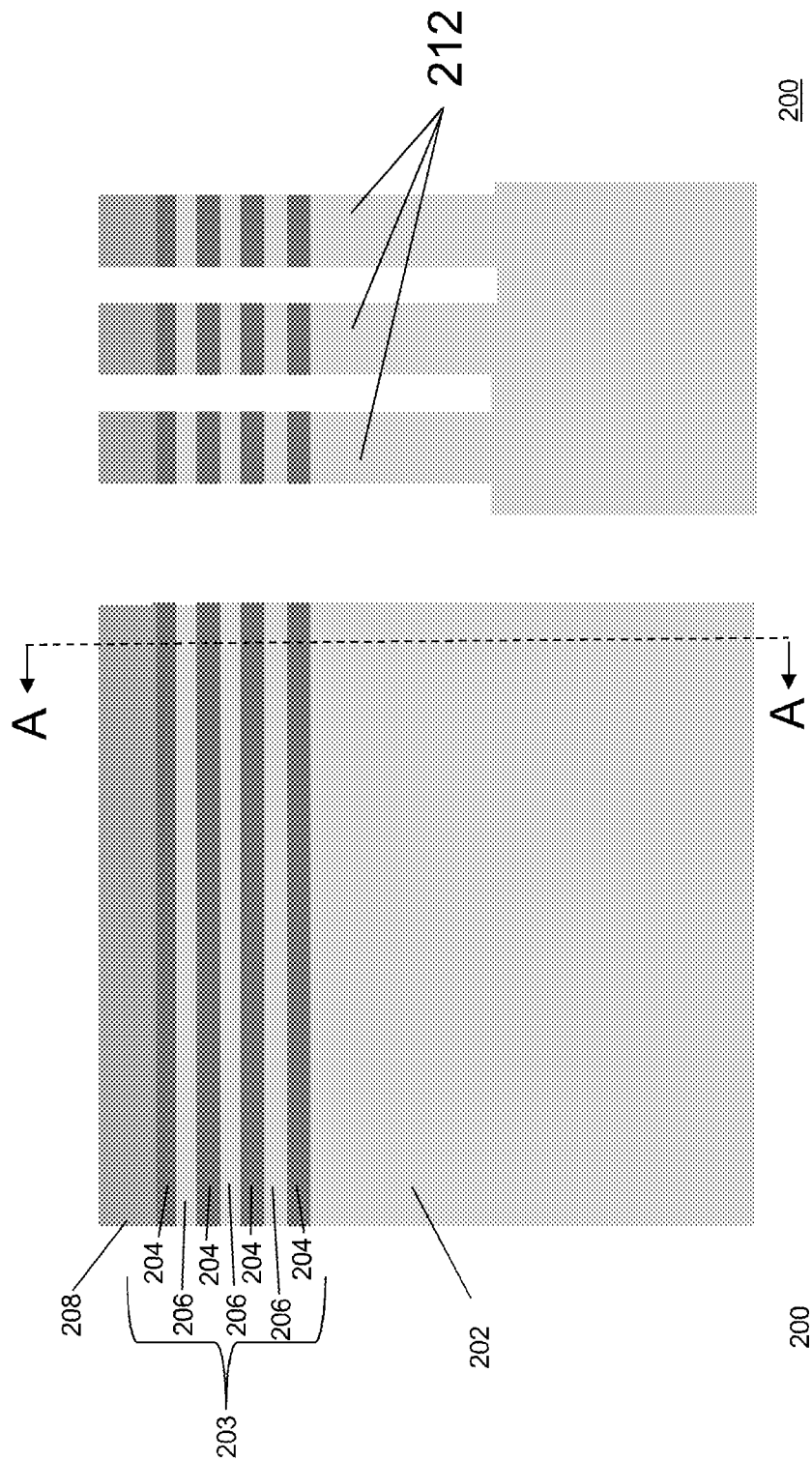

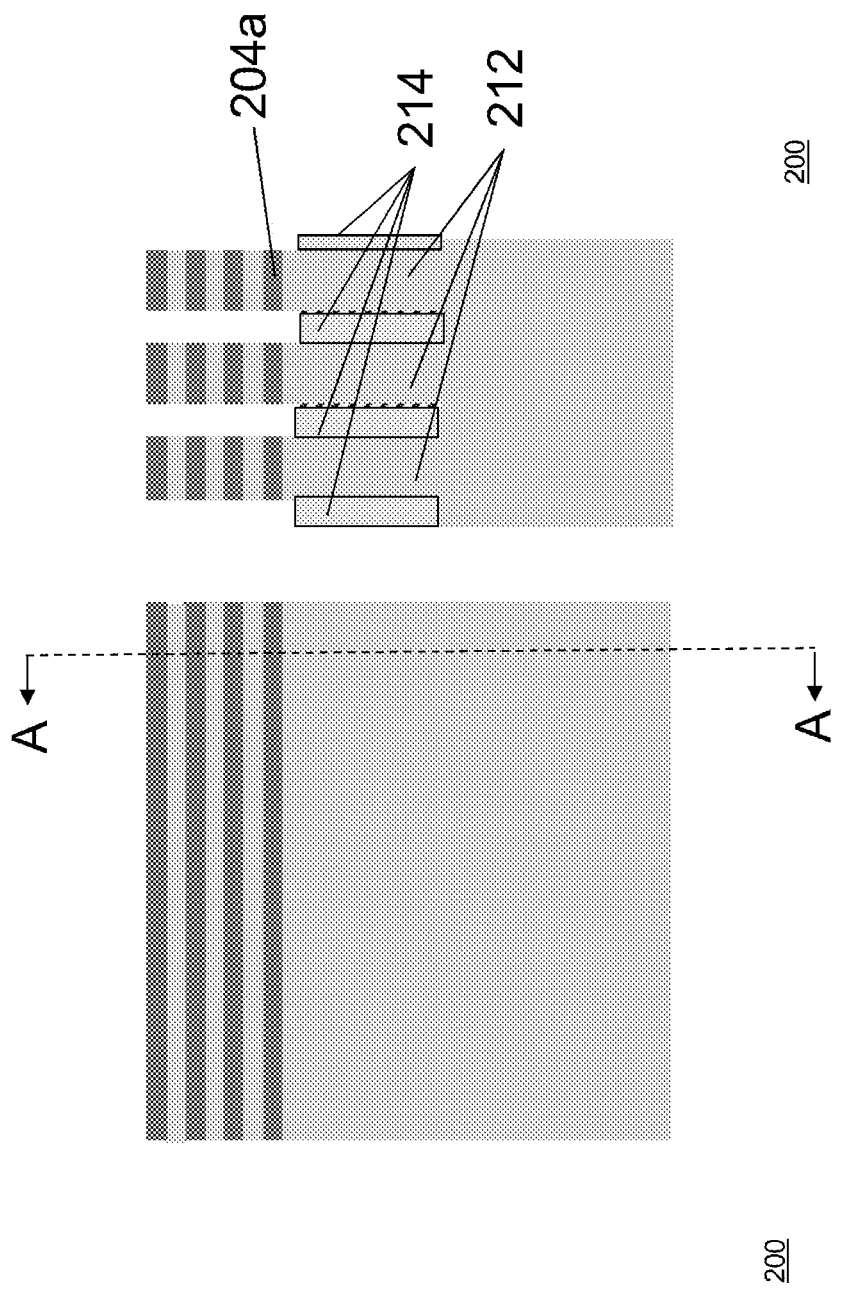

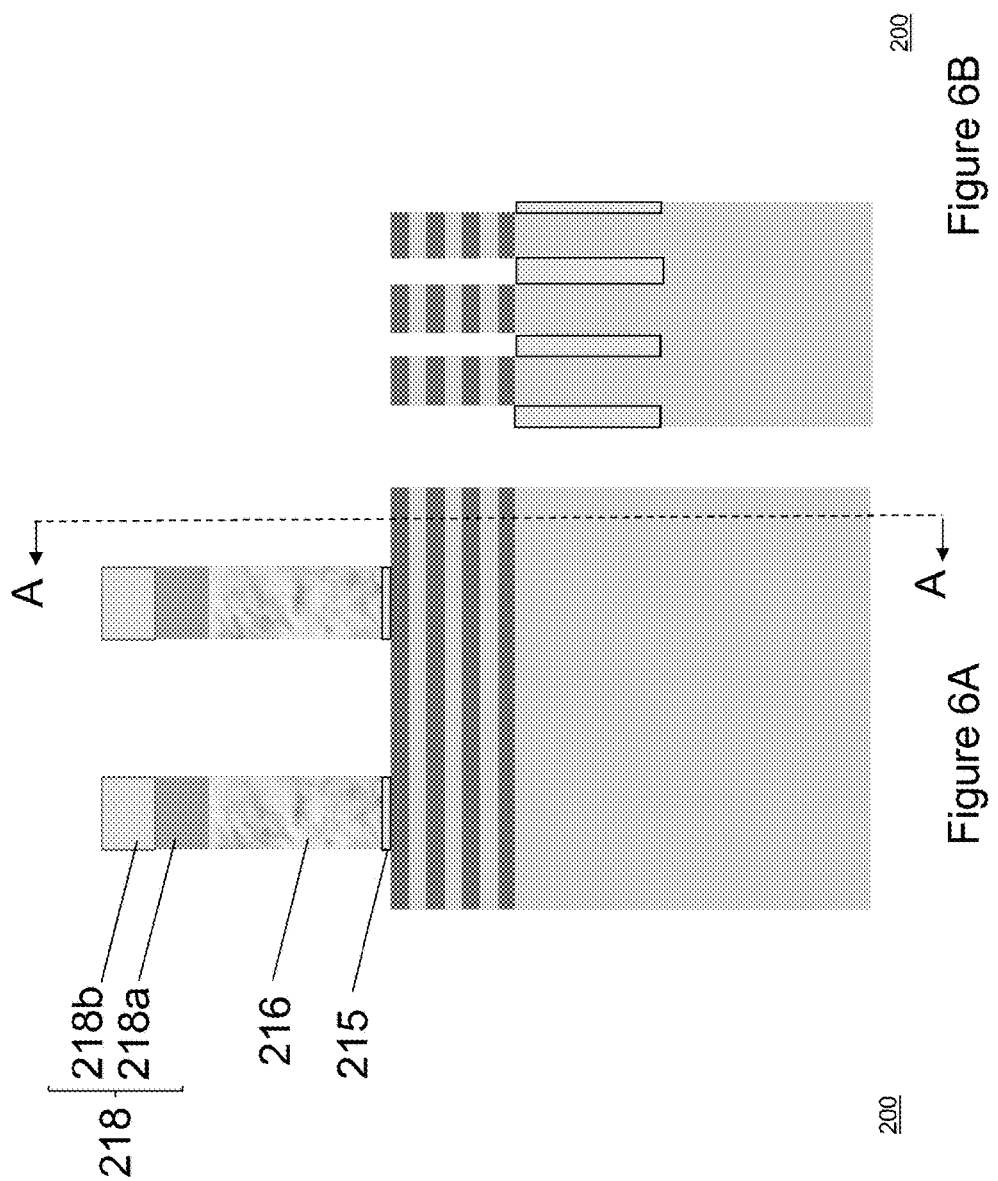

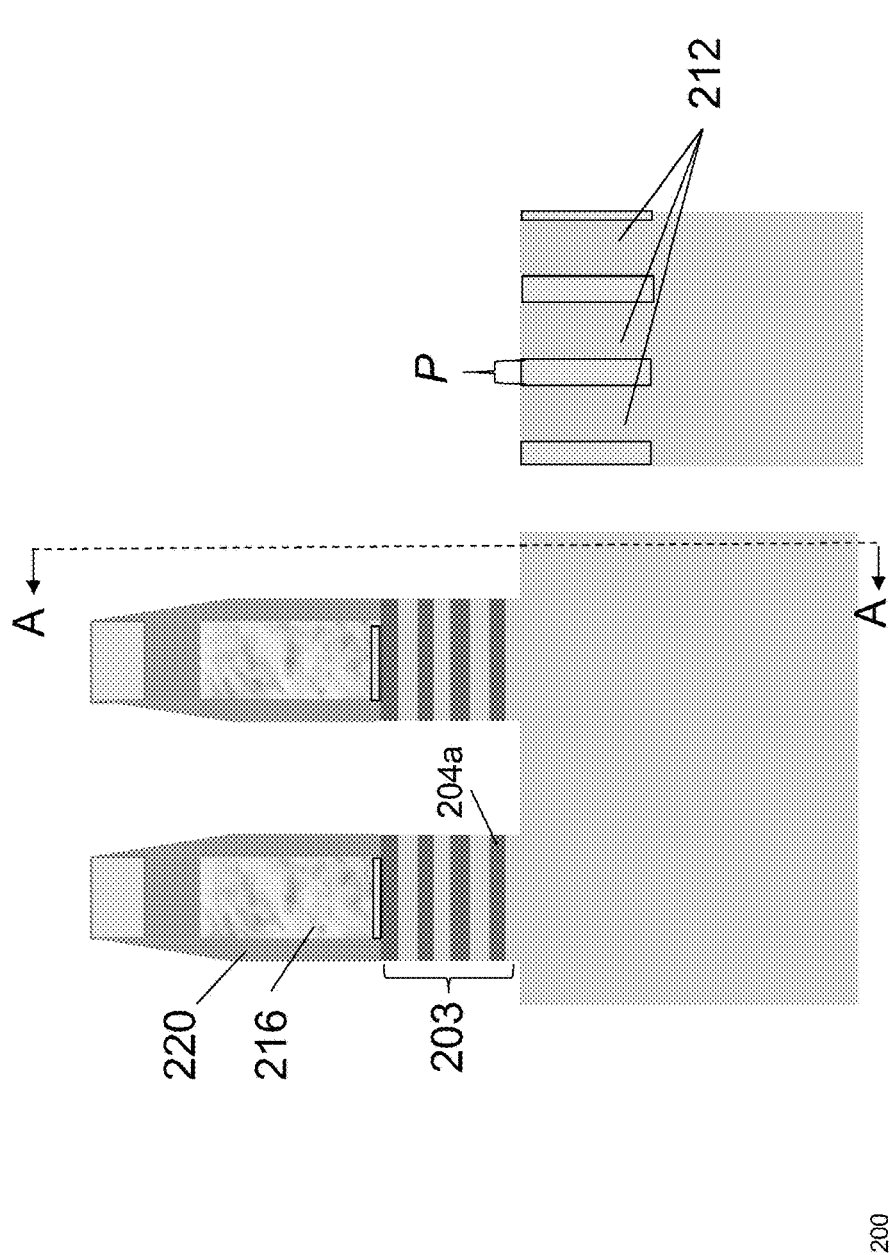

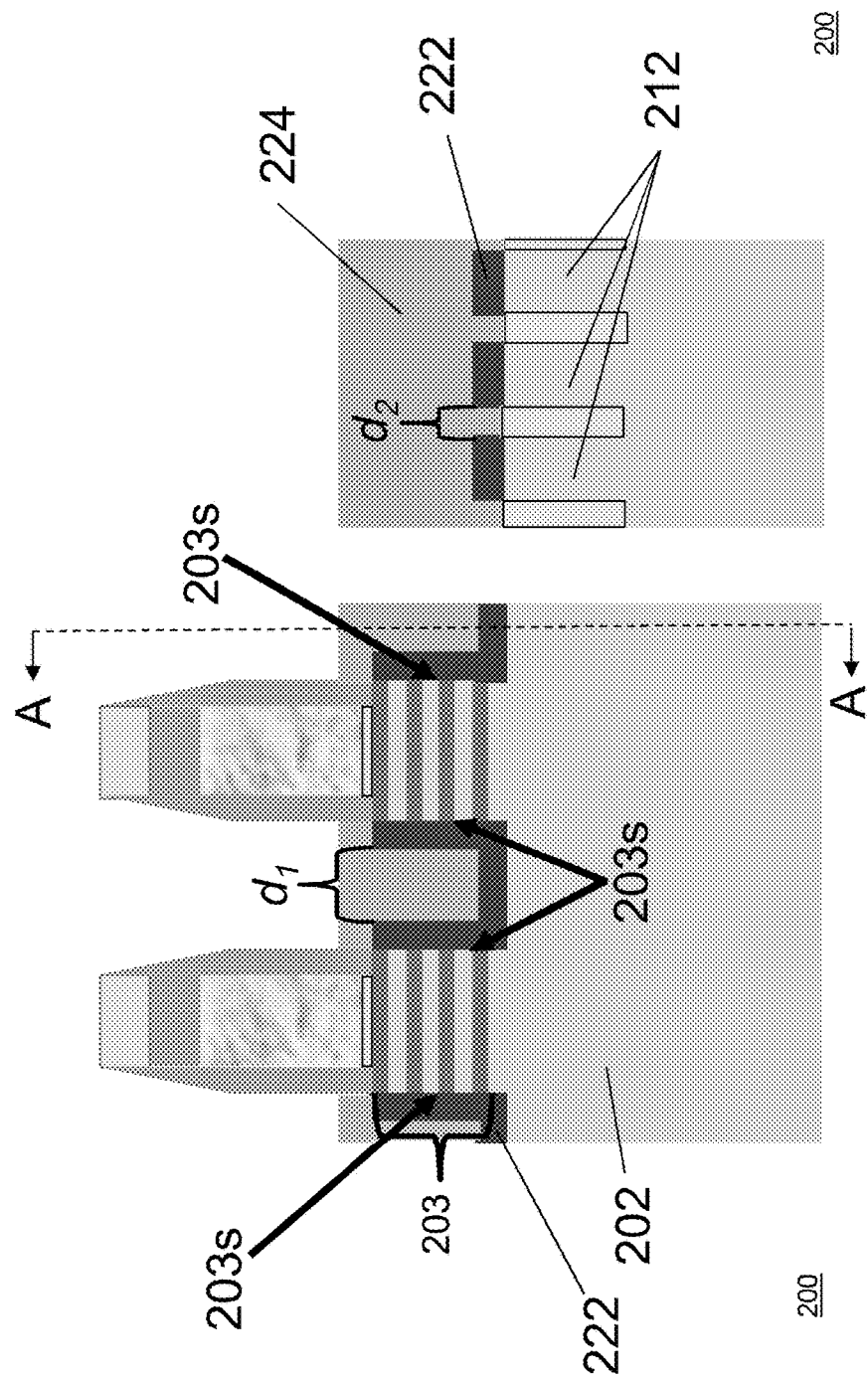

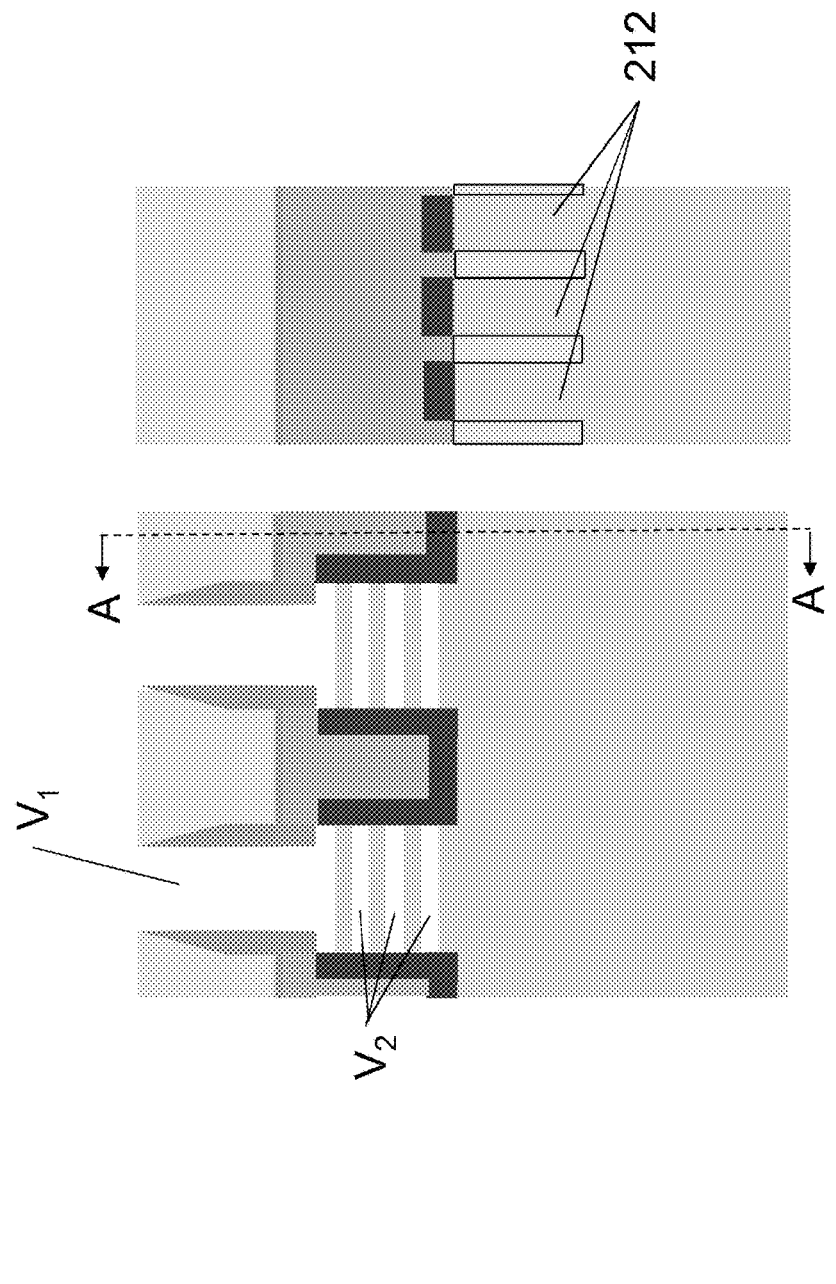

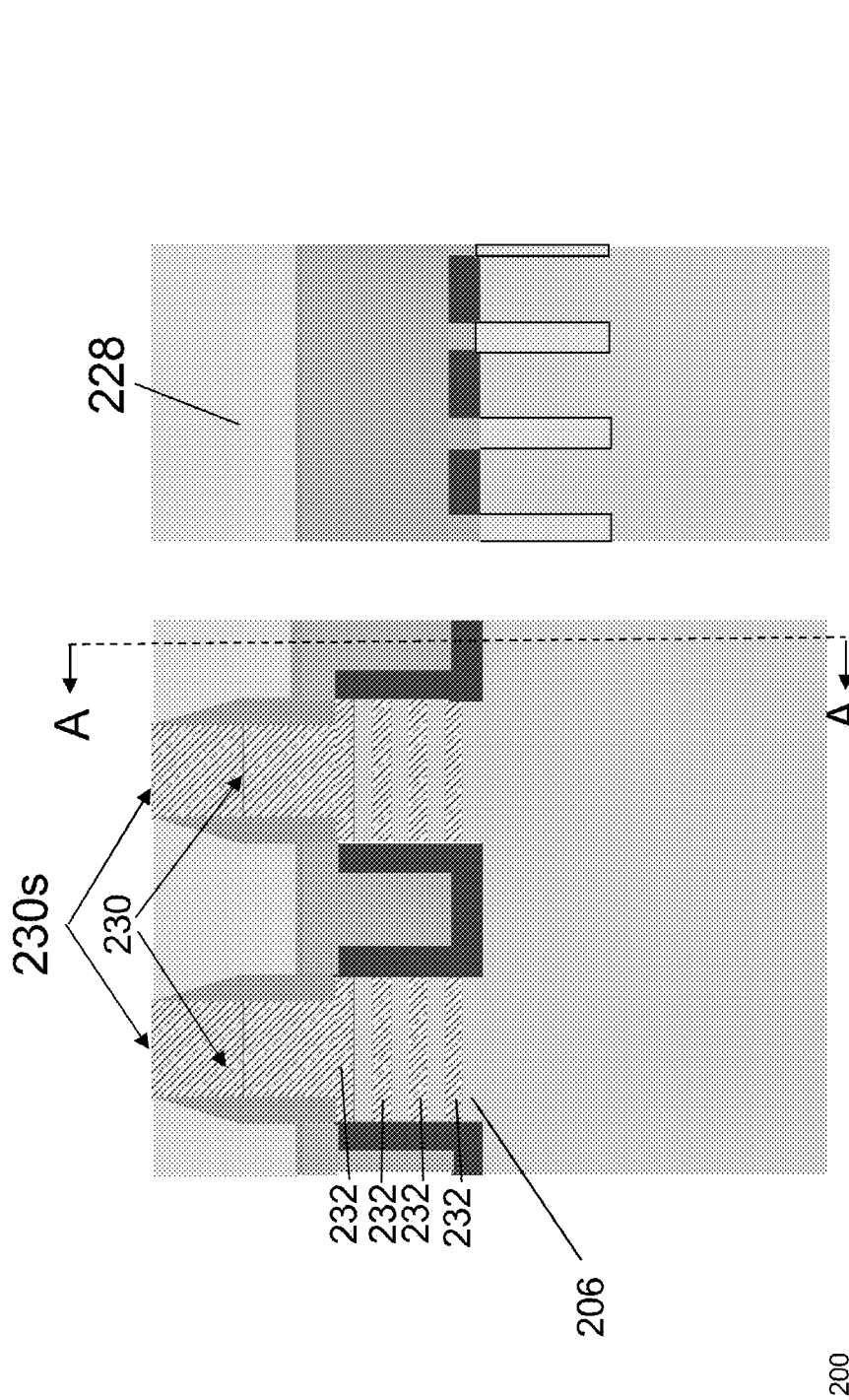

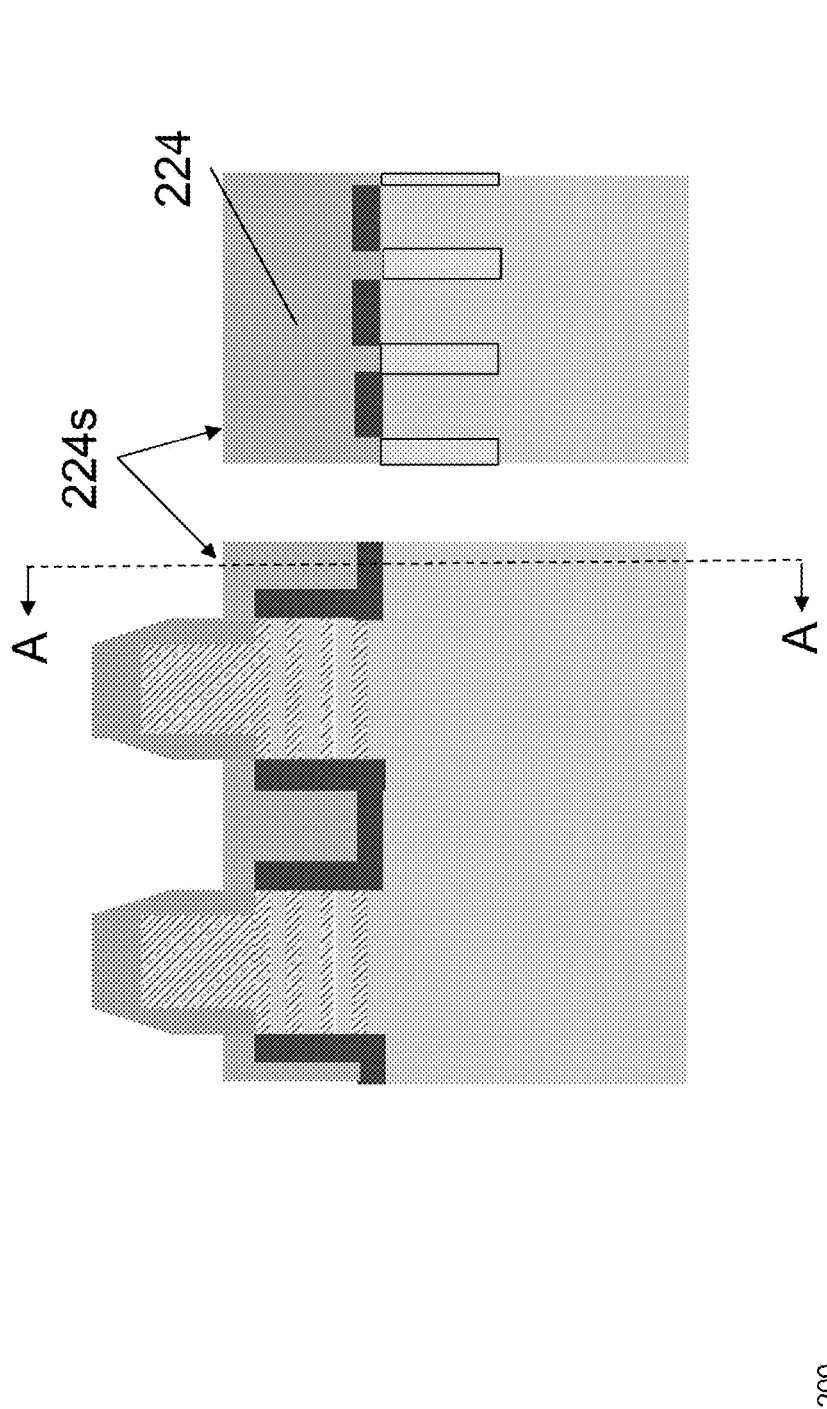

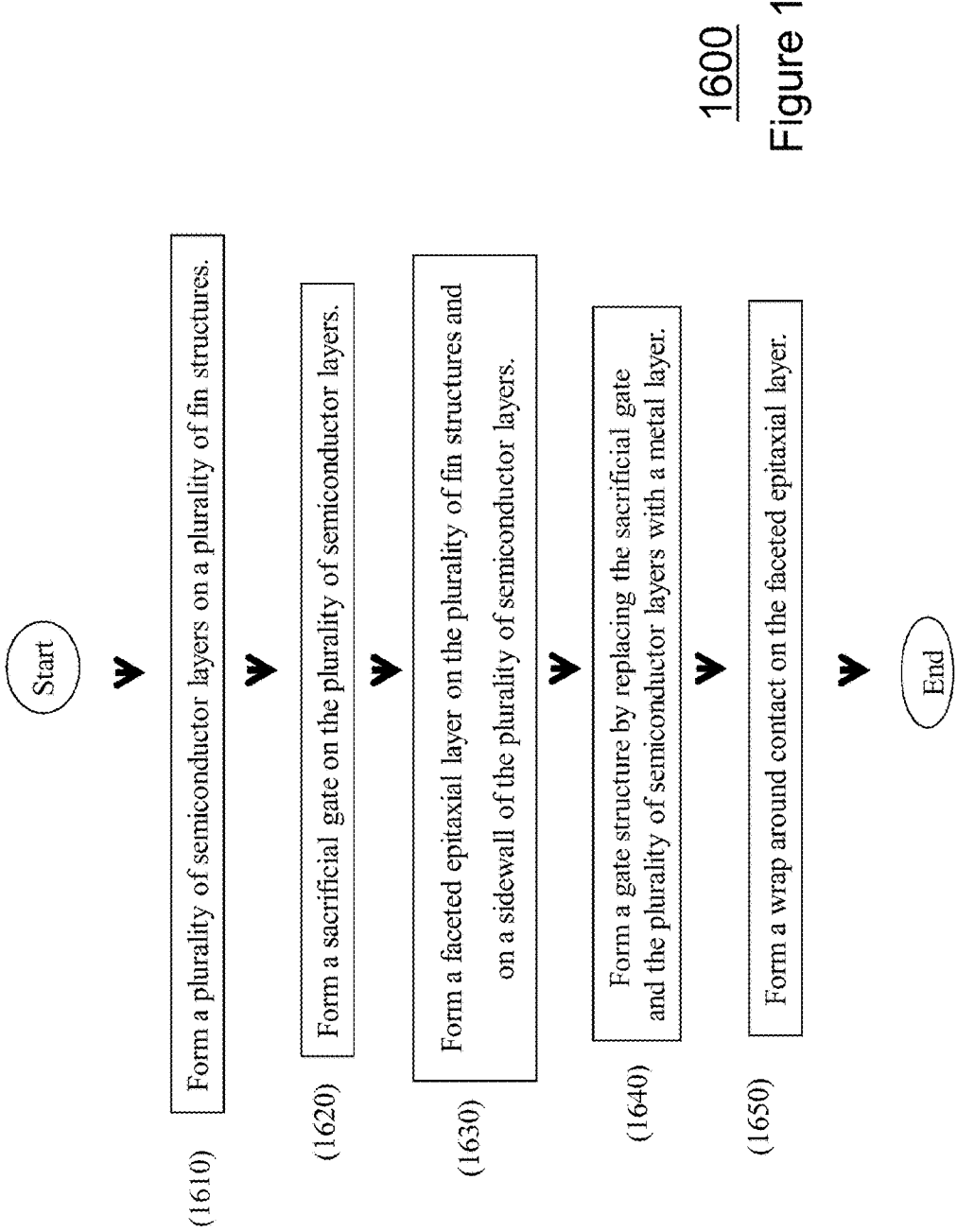

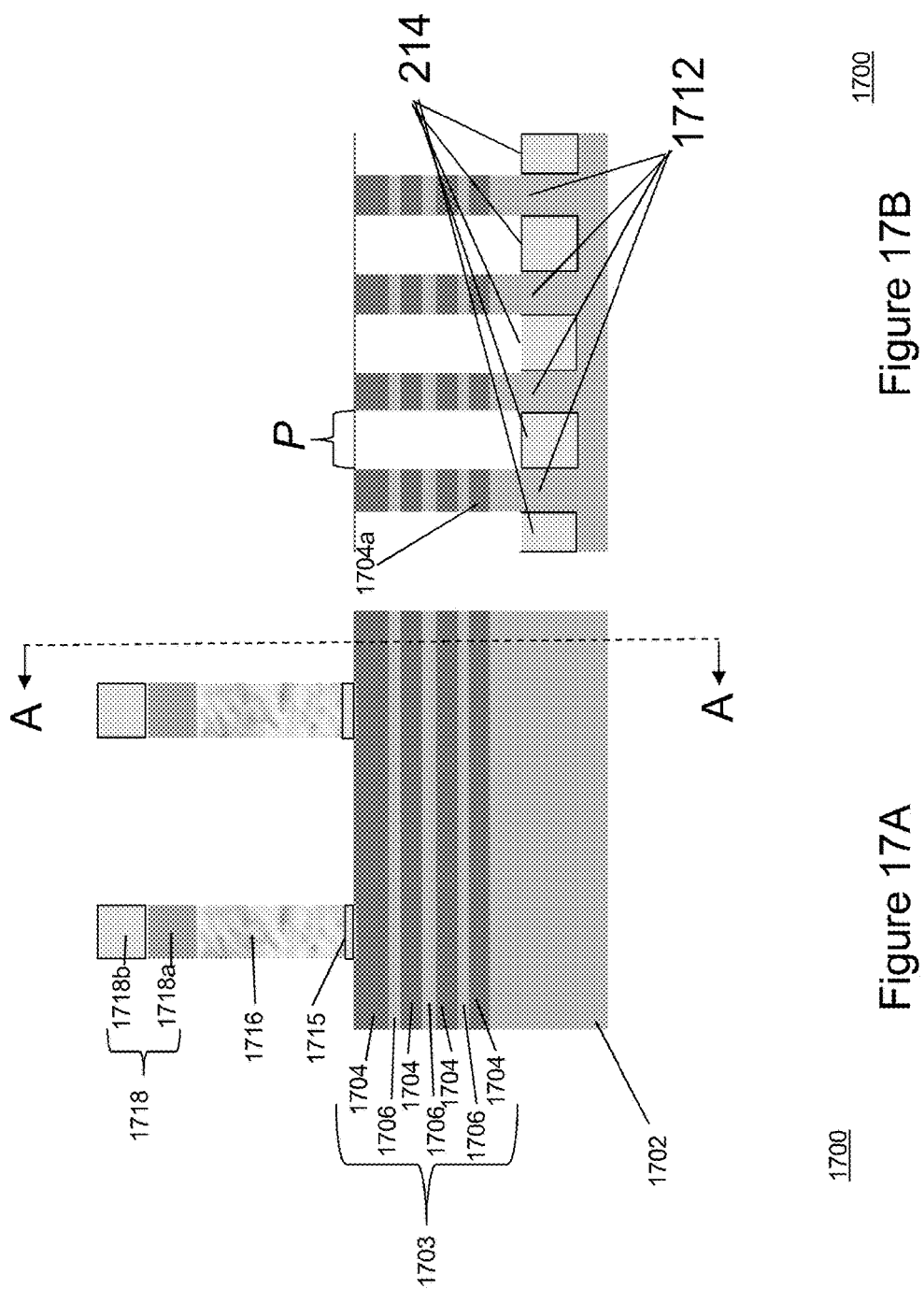

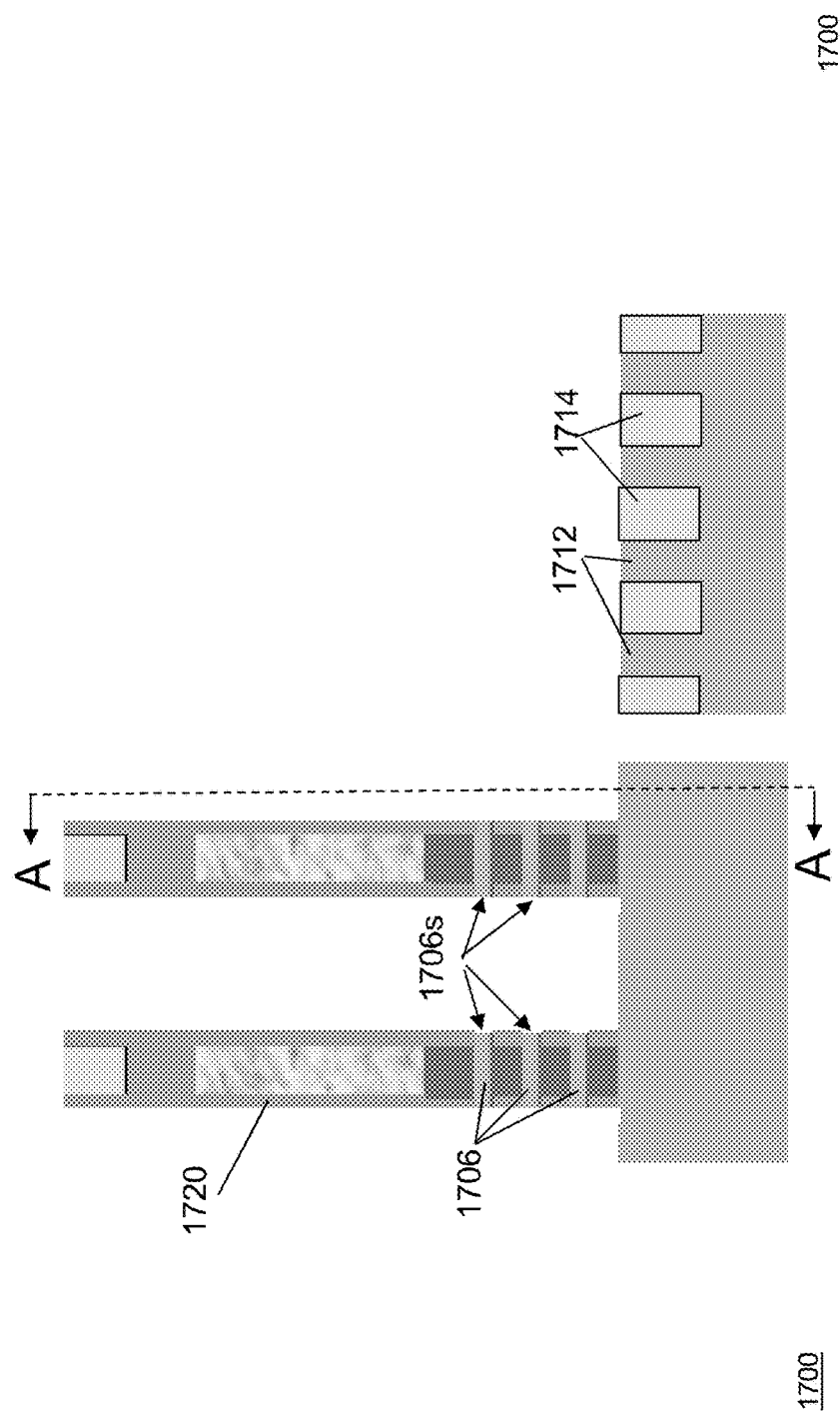

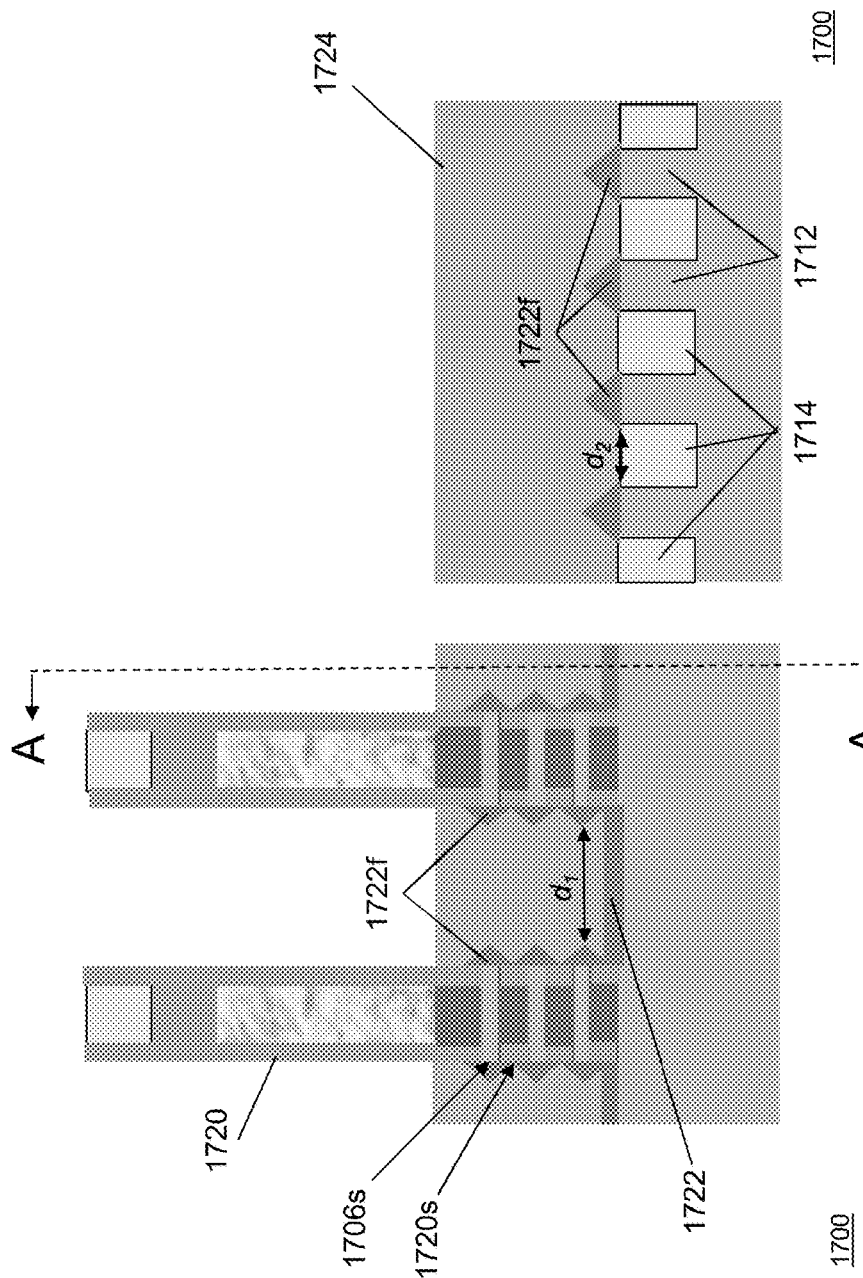

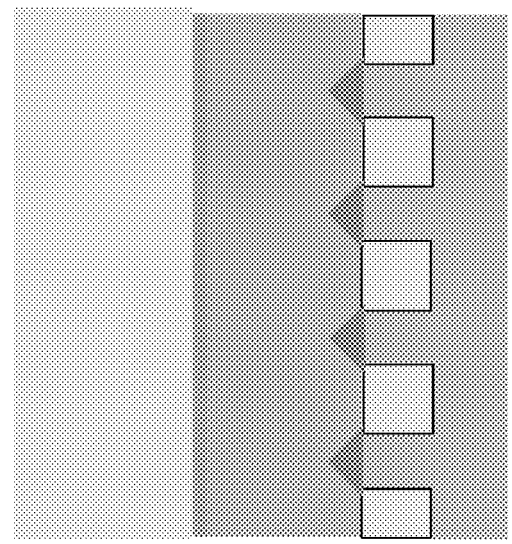
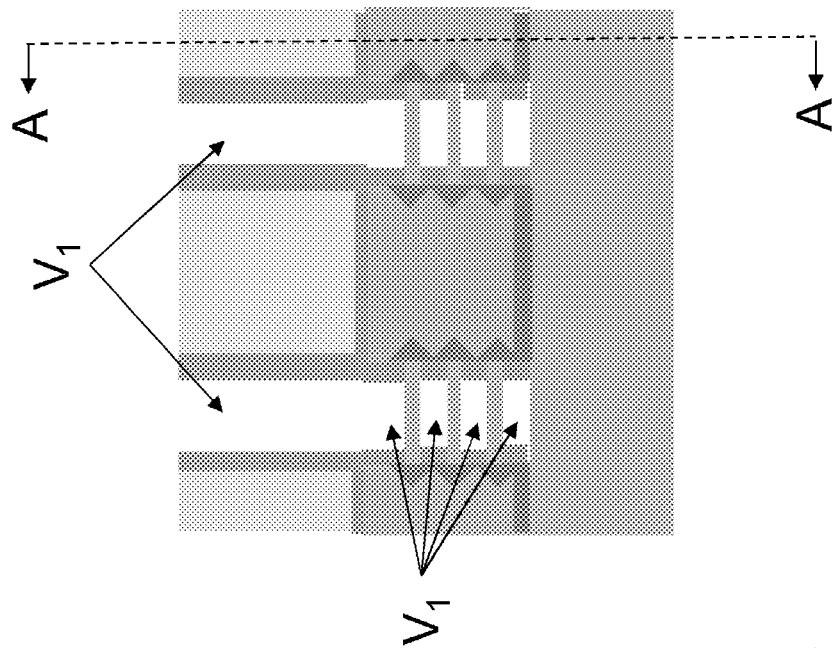
Figure 24A
Figure 24B

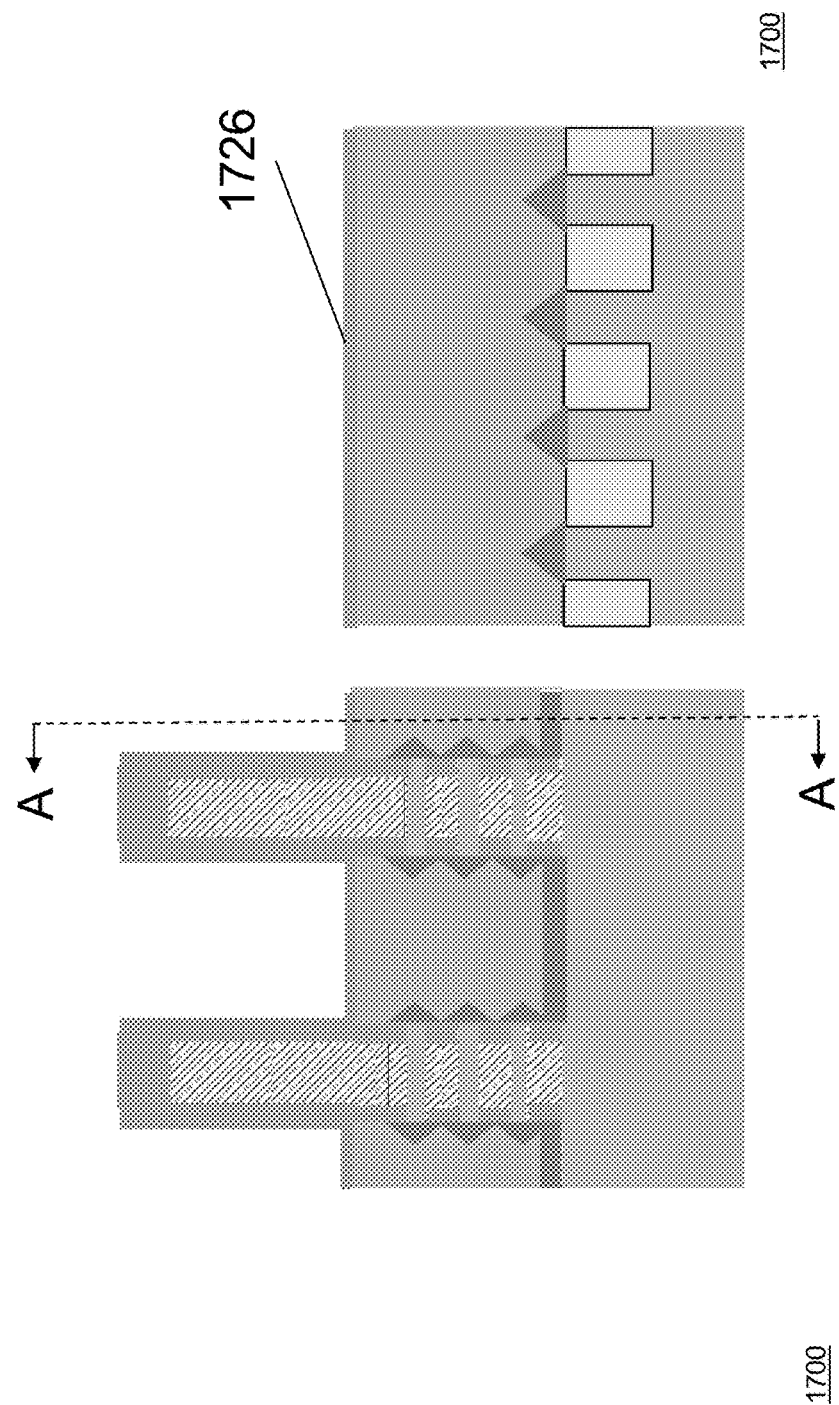

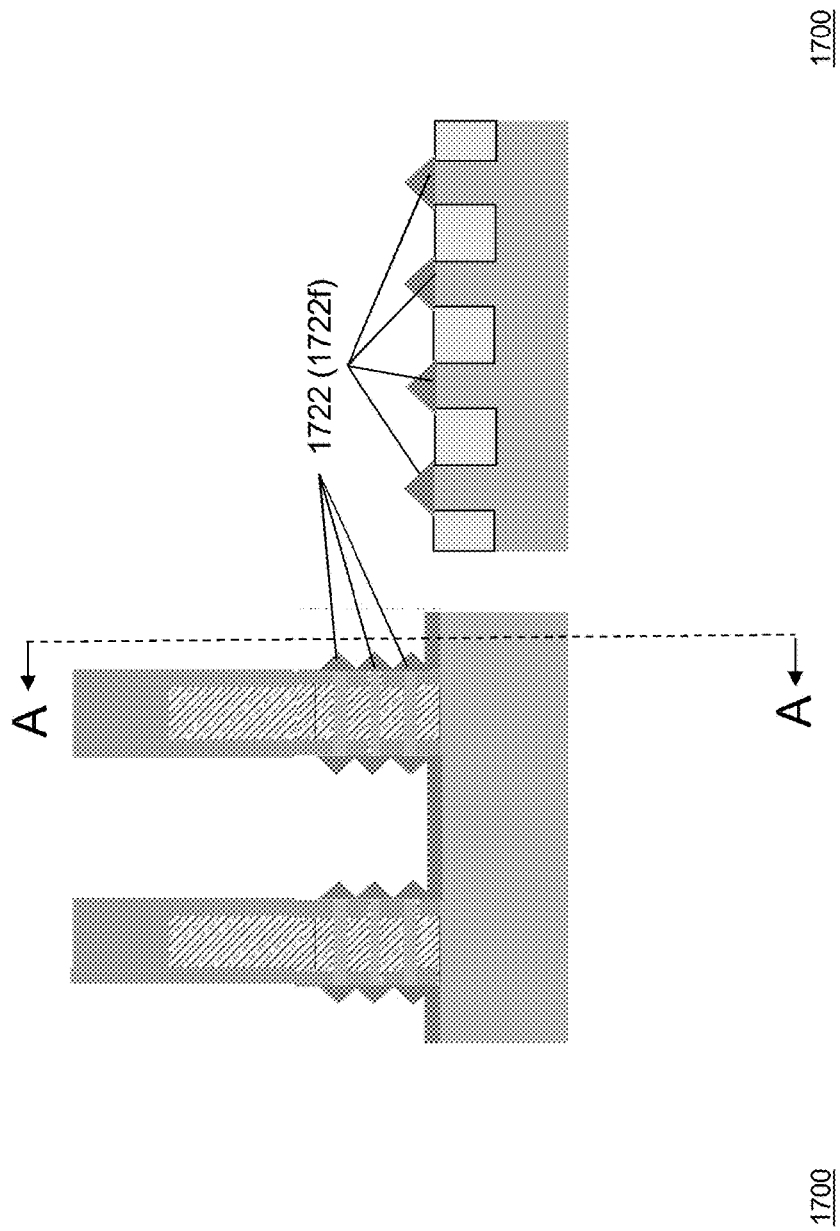

SEMICONDUCTOR DEVICE INCLUDING WRAP AROUND CONTACT, AND METHOD OF FORMING THE SEMICONDUCTOR DEVICE

BACKGROUND OF THE INVENTION

Field of the Invention

The present invention relates to a semiconductor device including a wrap around contact, and more particularly, a wrap around contact which may provide an improved contact resistance.

Description of the Related Art

The fin field effect transistor (finFET) has become a common feature of semiconductor integrated circuits (ICs). In a finFET, the channel is formed by a semiconductor vertical fin, and a gate electrode is located and wrapped around the fin.

In finFETs, as with other forms of transistors, contacts formed on the source, drain, and gate of the transistor are used to connect the transistor to other components of the semiconductor IC. To ensure that the IC is reliable and has desired performance characteristics, it is important to reduce the contact resistance of the contacts.

In a related art finFET device, a diamond shaped epitaxial layer is formed on the fin, and a wrap around contact is formed around the diamond shaped epitaxial layer. The wrap around contact may thereby decrease the contact resistance in the finFET by increasing the silicide interfacial area.

SUMMARY

In view of the foregoing and other problems, disadvantages, and drawbacks of the aforementioned conventional devices and methods, an exemplary aspect of the present invention is directed to a semiconductor device including a wrap around contact which may have an improved contact resistance over conventional devices.

An exemplary aspect of the present invention is directed to a method of forming a wrap around contact, includes forming a plurality of semiconductor layers on a plurality of fin structures, forming a sacrificial gate on the plurality of semiconductor layers, forming an epitaxial layer on the plurality of fin structures and on a sidewall of the plurality of semiconductor layers, forming a gate structure by replacing the sacrificial gate and the plurality of semiconductor layers with a metal layer, and forming a wrap around contact on the epitaxial layer.

Another exemplary aspect of the present invention is directed to a semiconductor device, including a plurality of semiconductor layers formed on a plurality of fin structures, an epitaxial layer formed on the plurality of fin structures and on a sidewall of the plurality of semiconductor layers, a gate structure formed on the plurality of semiconductor layers, and a wrap around contact formed on the epitaxial layer.

Another exemplary aspect of the present invention is directed to a method of forming a wrap around contact, including forming a plurality of semiconductor layers on a plurality of fin structures, forming a sacrificial gate on the plurality of semiconductor layers, forming a faceted epitaxial layer on the plurality of fin structures and on a sidewall of the plurality of semiconductor layers, forming a gate structure by replacing the sacrificial gate and the plurality of semiconductor layers with a metal layer, and forming a wrap around contact on the faceted epitaxial layer.

Another exemplary aspect of the present invention is directed to a semiconductor device, including a plurality of semiconductor layers formed on a plurality of fin structures, a faceted epitaxial layer formed on the plurality of fin structures and on a sidewall of the plurality of semiconductor layers, a gate structure formed on the plurality of semiconductor layers, and a wrap around contact formed on the faceted epitaxial layer.

Another exemplary aspect of the present invention is directed to a method of forming a wrap around contact, including forming a plurality of shallow trench isolation (STI) regions between a plurality of fin structures, alternately forming a plurality of semiconductor layers and a plurality of other semiconductor layers on the plurality of fin structures, forming a plurality of sacrificial gates on the plurality of semiconductor layers and the plurality of other semiconductor layers, forming an conformal highly-doped epitaxial layer on the plurality of fin structures and on a sidewall of the plurality of semiconductor layers and a sidewall of the plurality of other semiconductor layers, forming a plurality of gate structures by replacing the sacrificial gate and the plurality of semiconductor layers with a metal layer, the gate structure comprising a spacer formed on a side of the metal layer, the replacing of the semiconductor layers comprising performing an etching to remove the sacrificial gate and remove the semiconductor layers from between the other semiconductor layers, and forming a wrap around contact on the epitaxial layer, the wrap around contact being formed on the STI regions, on the spacer and on the epitaxial layer between the plurality of gate structures, the forming of the wrap around contact including forming a conformal metal liner layer, forming a barrier layer on the metal liner layer, and annealing the metal liner layer to form a metal silicide layer, the wrap around contact comprising the metal silicide layer and the barrier layer.

With its unique and novel features, the present invention provides semiconductor device including a wrap around contact which may have an improved contact resistance over conventional devices.

BRIEF DESCRIPTION OF THE DRAWINGS

The foregoing and other objects, aspects and advantages will be better understood from the following detailed description of the embodiments of the invention with reference to the drawings, in which:

FIG. 3A illustrates a view across the gate structure in the etching of the substrate 202 and the first and second semiconductor layers 204, 206, to form fin structures 212 in the semiconductor device 200, according to an exemplary aspect of the present invention;

FIG. 3B illustrates a view of the semiconductor device 200 across the fin structures 212 and along cross section A-A in FIG. 3A, according to an exemplary aspect of the present invention;

FIG. 5A illustrates a view across the gate structure in the revealing of the fin structures 212 in the semiconductor device 200, according to an exemplary aspect of the present invention;

FIG. 5B illustrates a view of the semiconductor device 200 across the fin structures 212 and along cross section A-A in FIG. 5A, according to an exemplary aspect of the present invention;

FIG. 6A illustrates a view across the gate structure in the forming of the sacrificial gate 216 in the semiconductor device 200, according to an exemplary aspect of the present invention;

FIG. 6B illustrates a view of the semiconductor device 200 across the fin structures 212 and along cross section A-A in FIG. 6A, according to an exemplary aspect of the present invention;

FIG. 7A illustrates a view across the gate structure in the forming of spacers 220 on the sacrificial gate 216 in the semiconductor device 200, according to an exemplary aspect of the present invention;

FIG. 7B illustrates a view of the semiconductor device 200 across the fin structures 212 and along cross section A-A in FIG. 7A, according to an exemplary aspect of the present invention;

FIG. 8A illustrates a view across the gate structure in the forming of the epitaxial layer 222 on the semiconductor layers 203 in the semiconductor device 200, according to an exemplary aspect of the present invention;

FIG. 8B illustrates a view of the semiconductor device 200 across the fin structures 212 and along cross section A-A in FIG. 8A, according to an exemplary aspect of the present invention;

FIG. 10A illustrates a view across the gate structure in the etching of the sacrificial gate 216 in the semiconductor device 200, according to an exemplary aspect of the present invention;

FIG. 10B illustrates a view of the semiconductor device 200 across the fin structures 212 and along cross section A-A in FIG. 10A, according to an exemplary aspect of the present invention;

FIG. 11A illustrates a view across the gate structure in the forming of the gate structure 230 (e.g., plurality of gate structures 230) in the semiconductor device 200, according to an exemplary aspect of the present invention;

FIG. 11B illustrates a view of the semiconductor device 200 across the fin structures 212 and along cross section A-A in FIG. 11A, according to an exemplary aspect of the present invention;

FIG. 13A illustrates a view across the gate structure in the etching of the oxide layer 228 in the semiconductor device 200, according to an exemplary aspect of the present invention;

FIG. 13B illustrates a view of the semiconductor device 200 across the fin structures 212 and along cross section A-A in FIG. 13A, according to an exemplary aspect of the present invention;

FIG. 16 illustrates a method 1600 of forming a wrap around contact, according to another exemplary aspect of the present invention;

FIG. 17A illustrates a view across the gate structure in the forming of the gate structures 1716, in the semiconductor device 1700, according to an exemplary aspect of the present invention;

FIG. 17B illustrates a view of the semiconductor device 1700 across the fin structures 1712 and along cross section A-A in FIG. 17A, according to an exemplary aspect of the present invention;

FIG. 21A illustrates a view across the gate structure in etching of the etching of the spacer 1720, in the semiconductor device 1700, according to an exemplary aspect of the present invention;

FIG. 21B illustrates a view of the semiconductor device 1700 across the fin structures 1712 and along cross section A-A in FIG. 21A, according to an exemplary aspect of the present invention;

FIG. 22A illustrates a view across the gate structure in the forming of the faceted epitaxial layer 1722 in the semiconductor device 1700, according to an exemplary aspect of the present invention;

FIG. 22B illustrates a view of the semiconductor device 1700 across the fin structures 1712 and along cross section A-A in FIG. 22A, according to an exemplary aspect of the present invention;

FIG. 24A illustrates a view across the gate structure in the etching of the sacrificial gate 1716 in the semiconductor device 1700, according to an exemplary aspect of the present invention;

FIG. 24B illustrates a view of the semiconductor device 1700 across the fin structures 1712 and along cross section A-A in FIG. 24A, according to an exemplary aspect of the present invention;

FIG. 26A illustrates a view across the gate structure in the removal of the oxide layer 1728 in the semiconductor device 1700, according to an exemplary aspect of the present invention;

FIG. 26B illustrates a view of the semiconductor device 1700 across the fin structures 1712 and along cross section A-A in FIG. 26A, according to an exemplary aspect of the present invention;

FIG. 27A illustrates a view across the gate structure in the removal of the POC liner layer 1726 and sacrificial layer 1724 in the semiconductor device 1700, according to an exemplary aspect of the present invention;

FIG. 27B illustrates a view of the semiconductor device 1700 across the fin structures 1712 and along cross section A-A in FIG. 27A, according to an exemplary aspect of the present invention.

DETAILED DESCRIPTION OF THE EXEMPLARY EMBODIMENTS OF THE INVENTION

Figure 1:
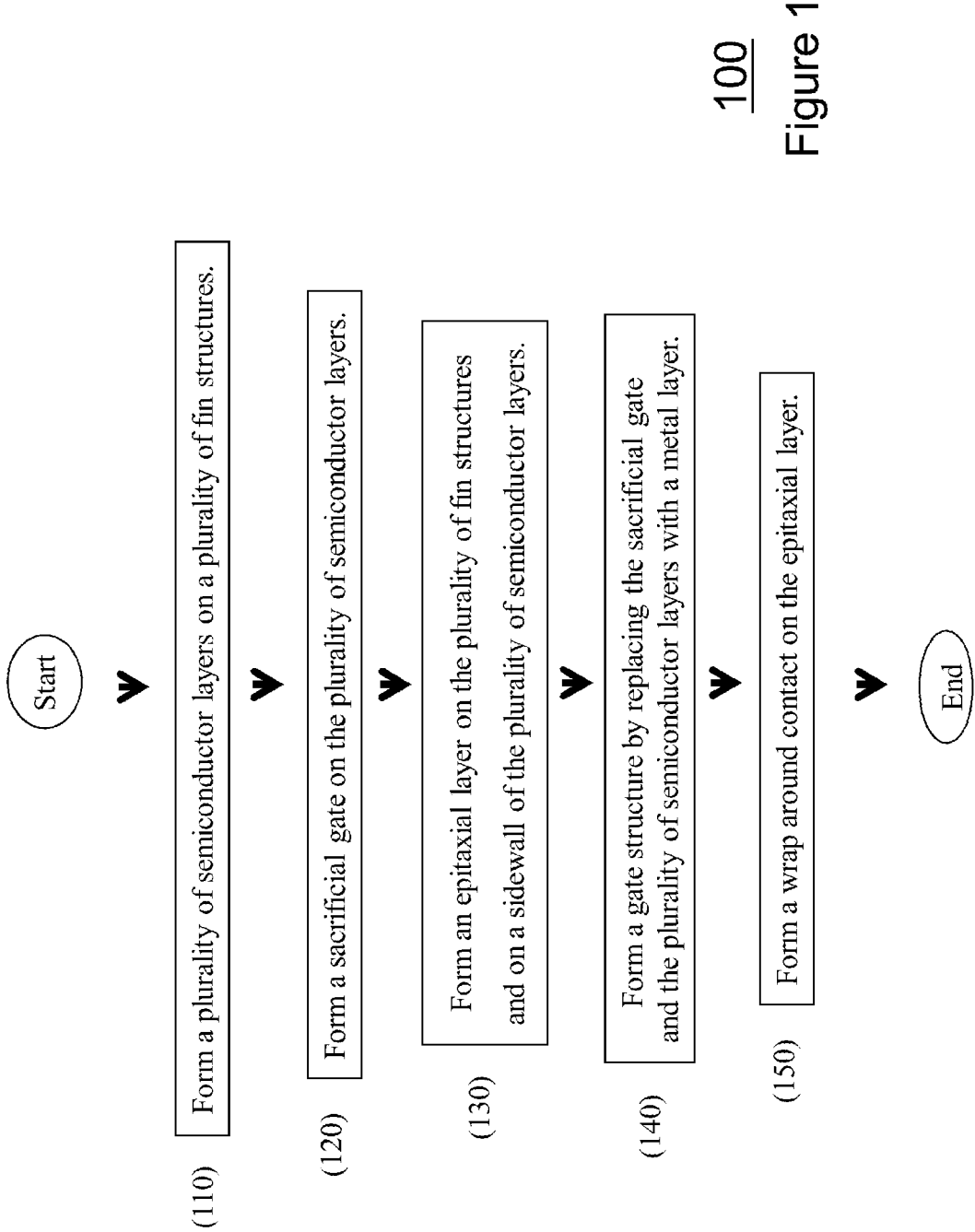
FIG. 1 illustrates a method 100 of forming a wrap around contact, according to an exemplary aspect of the present invention.

Referring now to the drawings, FIGS. 1-28B illustrate the exemplary aspects of the present invention.

As noted above, a wrap around contact may be used to reduce a contact resistance in a related art finFET devices. However, due to extreme scaling of the fin pitch (e.g., a fin pitch of less than 50 nm) in these related art devices, unmerged epitaxy (e.g., preventing an epitaxial layer formed on the fins from merging during formation) is extremely challenging. An alternative method to improve contact area (e.g., contact length) and thereby reduce contact resistance is to utilize the sidewalls of the fin structure to increase the interfacial area (e.g., form the epitaxial layer on the sidewalls of the fin structure).

An exemplary aspect of the present invention, on the other hand, may increase contact area (e.g., contact length) and reduce a contact resistance by using a wrap around contact, even for an extreme scaling of fin pitch (e.g., a fin pitch of less than 50 nm).

First Embodiment

FIG. 1 illustrates a method 100 of forming a wrap around contact, according to an exemplary aspect of the present invention.

As illustrated in FIG. 1, the method 100 includes forming (110) a plurality of semiconductor layers on a plurality of fin structures, forming (120) a sacrificial gate on the plurality of semiconductor layers, forming (130) an epitaxial layer (e.g., a conformal highly-doped epitaxial film) on the plurality of fin structures and on a sidewall of the plurality of semiconductor layers, forming (140) a gate structure by replacing the sacrificial gate and the plurality of semiconductor layers with a metal layer, and forming (150) a wrap around contact on the epitaxial layer.

The method 100 may also include forming a plurality of shallow trench isolation (STI) regions between the plurality of fin structures, the wrap around contact being formed on the STI regions. The forming (140) of the gate structure may include, for example, forming a plurality of gate structures, and the gate structure may include a spacer formed on a side of the metal layer. The forming (150) of the wrap around contact may include forming the wrap around contact on the spacer and on the epitaxial layer between the plurality of gate structures.

The forming (150) of the wrap around contact may include forming a conformal metal liner layer, forming a barrier layer on the metal liner layer, and annealing the metal liner layer to form a metal silicide layer, the wrap around contact comprising the metal silicide layer and the barrier layer. A metal fill layer may also be formed on the barrier layer.

The method 100 may also include forming a sacrificial layer to on the epitaxial layer, forming a liner layer on the sacrificial layer, forming an oxide layer on the liner layer, and polishing the oxide layer. The sacrificial layer may include, for example, germanium, the liner layer may include, for example, silicon nitride and the oxide layer may include, for example, titania-silica (TS) oxide.

The method 100 may also include forming a plurality of other semiconductor layers alternately with the plurality of semiconductor layers, and the replacing of the semiconductor layers may include performing an etching to remove the sacrificial gate and remove the semiconductor layers from between the other semiconductor layers.

Referring again to the drawings, FIGS. 2A-15B illustrate a method of forming a wrap around contact in a semiconductor device 200, according to another exemplary aspect of the present invention.

Figure 2A:
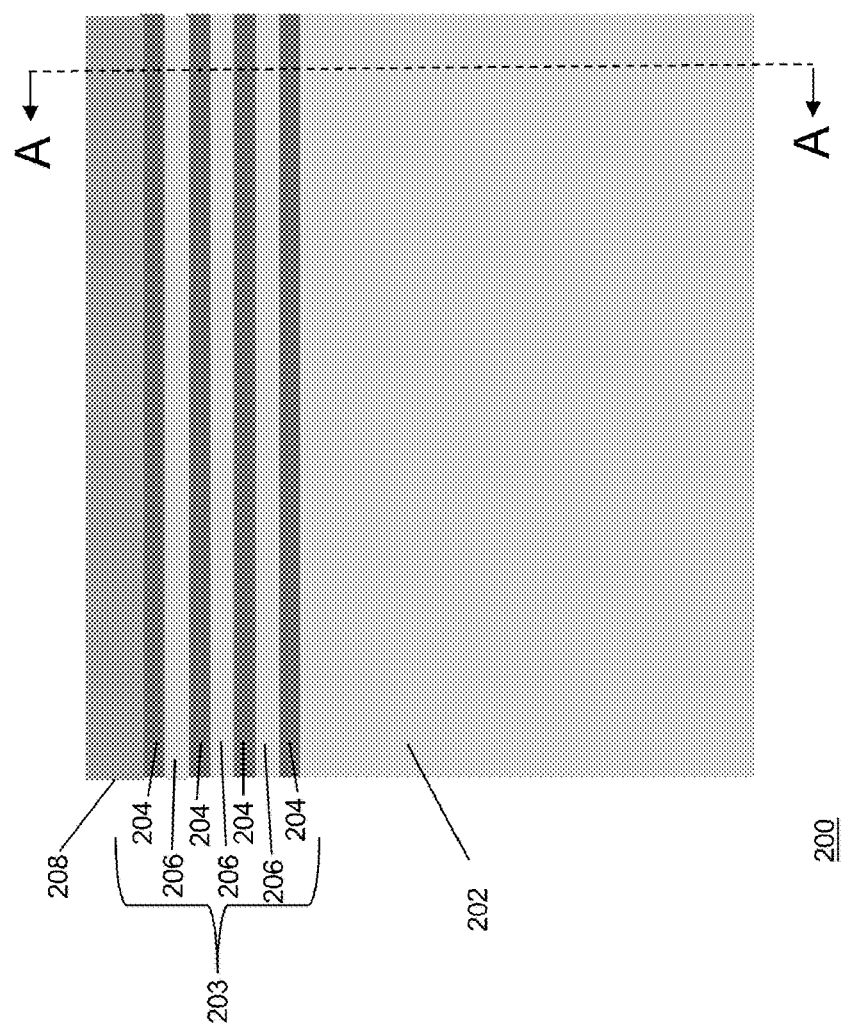
FIG. 2A illustrates a view across the gate structure in the forming of a plurality of semiconductor layers 203 on a substrate 202, in the semiconductor device 200, according to an exemplary aspect of the present invention.
Figure 2B:
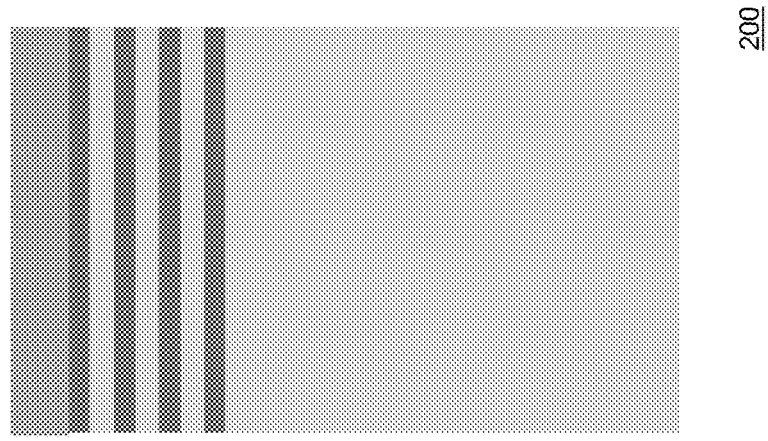
FIG. 2B illustrates a view of the semiconductor device 200 across the fin structures and along cross section A-A in FIG. 2A, according to an exemplary aspect of the present invention.

In particular, FIG. 2A illustrates a view across the gate structure in the forming of a plurality of semiconductor layers 203 on a substrate 202, in the semiconductor device 200, according to an exemplary aspect of the present invention. FIG. 2B illustrates a view of the semiconductor device 200 across the fin structures and along cross section A-A in FIG. 2A, according to an exemplary aspect of the present invention.

The semiconductor layers 203 may include first semiconductor layers 204 and second semiconductor layers 206. As illustrated in FIGS. 2A-2B, the first semiconductor layers 204 may be alternately formed with the second semiconductor layers 206 on the substrate 202. In particular, the semiconductor layers 203 include a nanosheet or a plurality of nanosheets having a thickness in a range from 1 nm to 100 nm.

The first semiconductor layers 204 may include, for example, silicon germanium (SiGe), (e.g., silicon germanium containing about 30% germanium) and the second semiconductor layers 206 may include, for example, silicon, and the substrate 202 may include, for example, silicon.

The first and second semiconductor layers 204, 206 may also be formed, for example, by epitaxy. That is, the first and second semiconductor layers 204, 206 may be epitaxial layers grown on the substrate 202. A thickness of the first and second semiconductor layers 204, 206 may be substantially the same and may be, for example, in a range from 2 nm to 15 nm.

As illustrated in FIG. 2A, the first semiconductor layer 204 may be first formed on the surface of the substrate 202, and may be the uppermost layer of the semiconductor layers 203. Although seven (7) semiconductor layers 203 are illustrated in FIGS. 2A-2B, other numbers of semiconductor layers 203 may be used.

As also illustrated in FIGS. 2A-2B, a hard mask 208 may be formed on the first and second semiconductor layers 204, 206. The hard mask 208 may include, for example, silicon nitride (SiN) and may be used for patterning of the semiconductor device 200.

FIG. 3A illustrates a view across the gate structure in the etching of the substrate 202 and the first and second semiconductor layers 204, 206, to form fin structures 212 in the semiconductor device 200, according to an exemplary aspect of the present invention. FIG. 3B illustrates a view of the semiconductor device 200 across the fin structures 212 and along cross section A-A in FIG. 3A, according to an exemplary aspect of the present invention.

The etching of the substrate 202 and the first and second semiconductor layers 204, 206 may utilize the hard mask 208. In particular, the etching may be performed by Reactive Ion Etching (RIE)

It is important to note that the space between the fin structures 212 may be small (e.g., less than 30 nm).

Figure 4B:
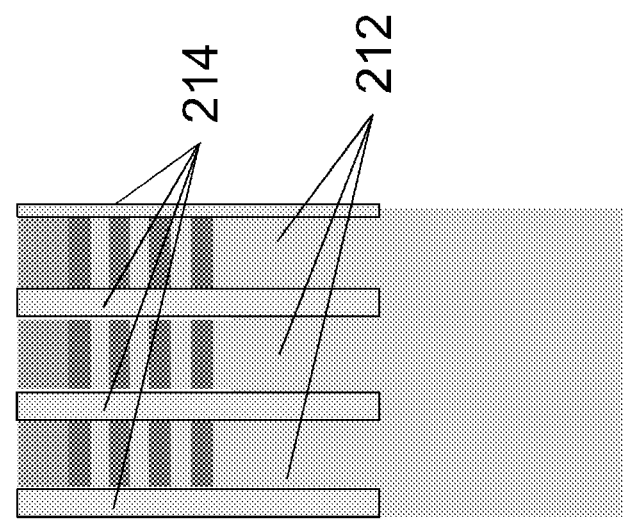
FIG. 4B illustrates a view of the semiconductor device 200 across the fin structures 212 and along cross section A-A in FIG. 4A, according to an exemplary aspect of the present invention.
Figure 4A:
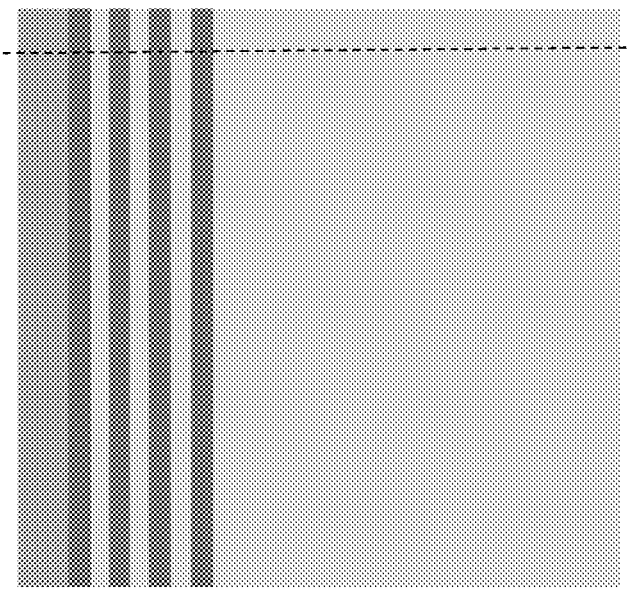
FIG. 4A illustrates a view across the gate structure in the forming of a shallow trench isolation (STI) region 214 in the semiconductor device 200, according to an exemplary aspect of the present invention.

FIG. 4B illustrates a view across the gate structure in the forming of a shallow trench isolation (STI) region 214 in the semiconductor device 200, according to an exemplary aspect of the present invention. In particular, FIG. 4B illustrates a view of the semiconductor device 200 across the fin structures 212 and along cross section A-A in FIG. 4A, according to an exemplary aspect of the present invention.

The STI region 214 may be formed, for example, by depositing an oxide. As illustrated in FIG. 4B, the STI region 214 may be formed to have an upper surface which is substantially co-planar with the upper surface of the hard mask 208 (e.g., by chemical mechanical polishing (CMP)).

FIG. 5B illustrates a view across the gate structure in the revealing of the fin structures 212 in the semiconductor device 200, according to an exemplary aspect of the present invention. In particular, FIG. 5B illustrates a view of the semiconductor device 200 across the fin structures 212 and along cross section A-A in FIG. 5A, according to an exemplary aspect of the present invention.

As illustrated in FIG. 5A, the STI regions 214 may be etched (e.g., by diluted HF, buffer HF or COR chemistry) to reveal the fin structures 212. The STI regions 214 may be etched down to the point at which the upper surface of the STI regions 214 is below the lowermost of the first semiconductor layers 204a. After the etching of the STI regions 214 to reveal the fin structures 212, the hard mask 208 may be removed, for example, by hot H3PO4 acid.

FIG. 6A illustrates a view across the gate structure in the forming of the sacrificial gate 216 in the semiconductor device 200, according to an exemplary aspect of the present invention. FIG. 6B illustrates a view of the semiconductor device 200 across the fin structures 212 and along cross section A-A in FIG. 6A, according to an exemplary aspect of the present invention.

As illustrated in FIG. 6A, a gate insulating layer 215 (e.g., gate oxide layer, such as silicon oxide, or high-k material) may be formed on the uppermost of the first and second semiconductor layers 204, 206, the sacrificial gate 216 may be formed on the gate insulating layer 215, and a mask 218 may be formed on the sacrificial gate 216.

The sacrificial gate 216 may be formed, for example, of polysilicon. The mask 218 may include, for example, a silicon nitride layer 218a formed on the sacrificial gate 216, and an oxide layer 218b (e.g., TS oxide, silicon oxide) formed on the silicon nitride layer 218a.

The gate insulating layer 215, the sacrificial gate 216 and the mask 218 may all be formed by deposition (e.g., physical vapor deposition (PVD), chemical vapor deposition (CVD), etc.)

The mask 218 may then be patterned, and then used to etch (e.g., pattern) the sacrificial gate 216 and the gate insulating layer 215, as illustrated in FIG. 6A. The etching may be performed, for example, by reactive ion etching (RIE).

FIG. 7A illustrates a view across the gate structure in the forming of spacers 220 on the sacrificial gate 216 in the semiconductor device 200, according to an exemplary aspect of the present invention. FIG. 7B illustrates a view of the semiconductor device 200 across the fin structures 212 and along cross section A-A in FIG. 7A, according to an exemplary aspect of the present invention.

The spacers 220 may be formed, for example, by depositing a silicon nitride layer on the device 200 (e.g., over the entire surface of the device 200), and then etching the silicon nitride layer using RIE (e.g., a directional etch) to form the spacers 220. The spacers 220 may be formed so as to be tapered in a direction away from the substrate 202.

As further illustrated in FIGS. 7A-7B, the etching may also remove a portion of the semiconductor layers 203 on the fin structures 212 and near the sacrificial gate 216. The semiconductor layers 203 may be etched down to the point at which the upper surface of the substrate 202 near the sacrificial gate 216 is below the lowermost of the first semiconductor layers 204a.

For example, where the semiconductor device 200 is to be a field effect transistor (FET), the semiconductor layers 203 may serve as a channel region for the FET.

As illustrated in FIG. 7B, the etching may be performed so that the entire semiconductor layers 203 on the fin structure 212 is etched away and the upper surface of the substrate 202 is substantially co-planar or below the upper surface of the STI regions 214. Again, the space between the fin structures 212 may less than 20 nm.

FIG. 8A illustrates a view across the gate structure in the forming of the epitaxial layer 222 on the semiconductor layers 203 in the semiconductor device 200, according to an exemplary aspect of the present invention. FIG. 8B illustrates a view of the semiconductor device 200 across the fin structures 212 and along cross section A-A in FIG. 8A, according to an exemplary aspect of the present invention.

As illustrated in FIG. 8A, the epitaxial layer 222 may be grown on a side wall 203s of the semiconductor layers 203, and on the upper surface of the substrate 202 adjacent to (e.g., between) the stacks of semiconductor layers 203. As illustrated in FIG. 8B, the epitaxial layer 222 may be formed on an upper surface of the fin structures 212. The epitaxial layer 222 may be conformally formed, and may have a thickness in a range from 1 nm to 10 nm.

The epitaxial layer 222 may include, for example, a doped epitaxial layer. For example, where the epitaxial layer 222 is silicon carbide, the dopant may include phosphorus, where the epitaxial layer is silicon germanium, the dopant may include boron, and so on. The epitaxial layer 222 may be used to form the source/drain junctions in the semiconductor device 200.

It is important to note that the forming of epitaxial layer 222 is done so as to avoid a merging of the epitaxial layer 222, and so as to allow room for a wrap around contact to be formed on the epitaxial layer 222. For example, as illustrated in FIGS. 8A-8B, a distance $d_1$ between the epitaxial layer 222 formed on the side walls 203s of the semiconductor layers, and a distance $d_2$ between the epitaxial layer 222 formed on the fin structures 212, should each be at least 5 nm.

Further, a sacrificial layer 224 may be formed (e.g., grown in situ, deposited by PVD, CVD, etc.) on the epitaxial layer 222. The sacrificial layer 224 may include, for example, germanium (e.g., undoped, pure germanium) or silicon germanium with a high germanium content (e.g., high % Ge). A height of the upper surface of the sacrificial layer 224 may be greater than a height of the upper surface of the epitaxial layer 222 formed on the sidewall 203s of the semiconductor layers 203.

Figure 9B:
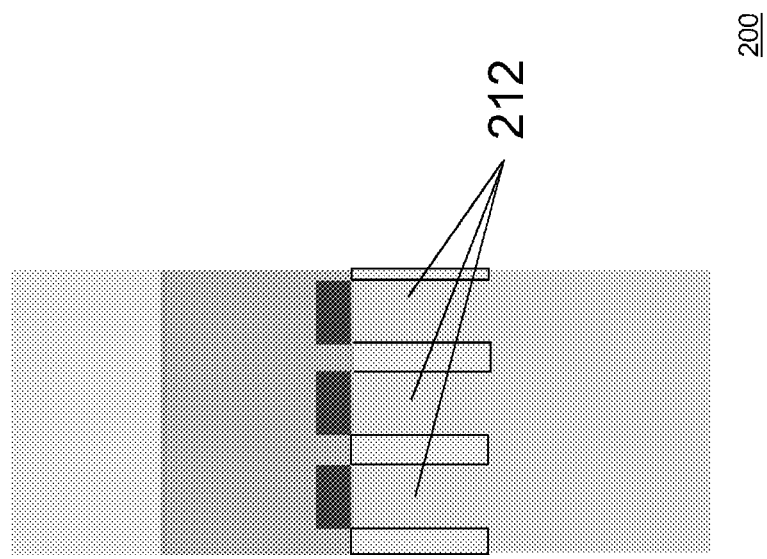
FIG. 9B illustrates a view of the semiconductor device 200 across the fin structures 212 and along cross section A-A in FIG. 9A, according to an exemplary aspect of the present invention.
Figure 9A:
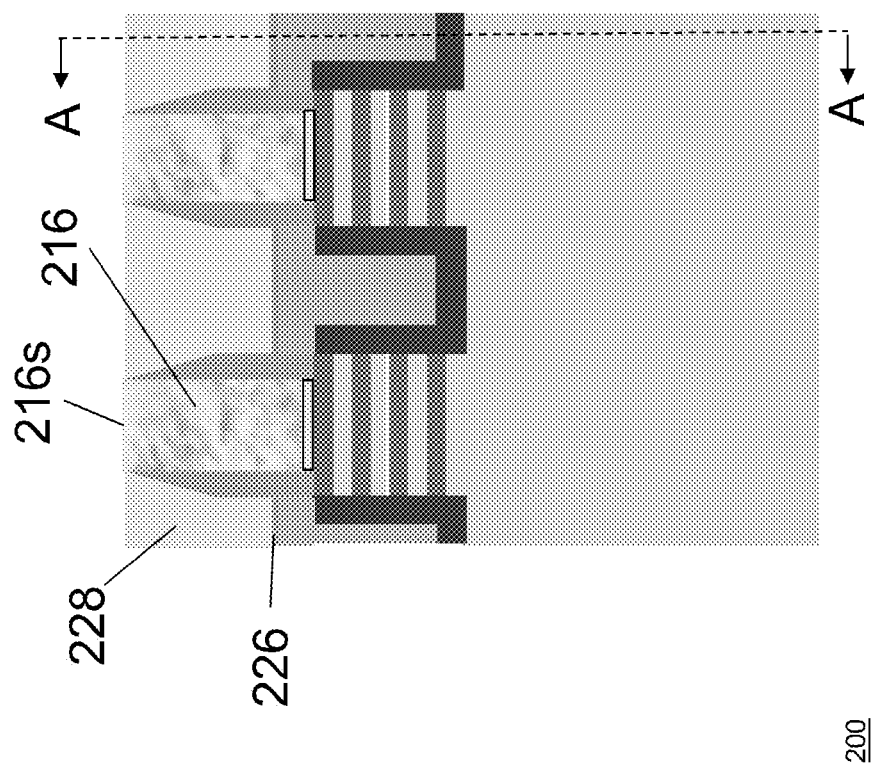
FIG. 9A illustrates a view across the gate structure in the performing of polyopen CMP (POC) in the semiconductor device 200, according to an exemplary aspect of the present invention.

FIG. 9A illustrates a view across the gate structure in the performing of poly open CMP (POC) in the semiconductor device 200, according to an exemplary aspect of the present invention. FIG. 9B illustrates a view of the semiconductor device 200 across the fin structures 212 and along cross section A-A in FIG. 9A, according to an exemplary aspect of the present invention.

As illustrated in FIGS. 9A-9B, a POC liner layer 226 may be formed (e.g., deposited by PVD, CVD, etc.) on the sacrificial layer 224, and an oxide layer 228 (e.g., TS oxide) may be formed (e.g., deposited by PVD, CVD, etc.) on the POC liner layer 226. The POC liner layer 926 may be, for example, silicon nitride or other low-k material.

After the oxide layer 228 is formed, CMP may be performed until an upper surface 216s of the sacrificial gate 216 (e.g., upper surface of the polysilicon) is exposed.

FIG. 10A illustrates a view across the gate structure in the etching of the sacrificial gate 216 in the semiconductor device 200, according to an exemplary aspect of the present invention. FIG. 10B illustrates a view of the semiconductor device 200 across the fin structures 212 and along cross section A-A in FIG. 10A, according to an exemplary aspect of the present invention.

As illustrated in FIG. 10A, an etching (e.g., selective etching) may be performed in order to remove the sacrificial gate 216 (polysilicon), so that a void $V_1$ is formed, and to remove the first semiconductor layers 204 (e.g., silicon germanium) so that a void $V_2$ (e.g., a plurality of voids $V_2$) is formed.

It is noted that the gate oxide 215 is not illustrated in FIGS. 10A-15A because the gate oxide 215 is gone at this point, having been removed after sacrificial etch of the sacrificial gate 216 and before the sacrificial etching of semiconductor layers 204.

FIG. 11A illustrates a view across the gate structure in the forming of the gate structure 230 (e.g., plurality of gate structures 230) in the semiconductor device 200, according to an exemplary aspect of the present invention. FIG. 11B illustrates a view of the semiconductor device 200 across the fin structures 212 and along cross section A-A in FIG. 11A, according to an exemplary aspect of the present invention.

As illustrated in FIG. 11A, a first metal is deposited on the semiconductor device 200 so as to fill the voids V2, so that layers 232 of the conductive material is formed between the second semiconductor layers 206. A second conductive material (e.g., metal such as tungsten, cobalt, or an alloy including tungsten or cobalt) may be deposited (e.g., PVD) on the semiconductor device 200 so as to completely fill the void $V_1$ (e.g., to fill the gate stack) to form the gate structure 230 (e.g., replacement metal gate (RMG)). The conductive material may then be polished (e.g., by CMP) so that an upper surface 230s of the gate structure 230 is substantially co-planar with an upper surface of the oxide layer 228.

Figures 12A, 12B:
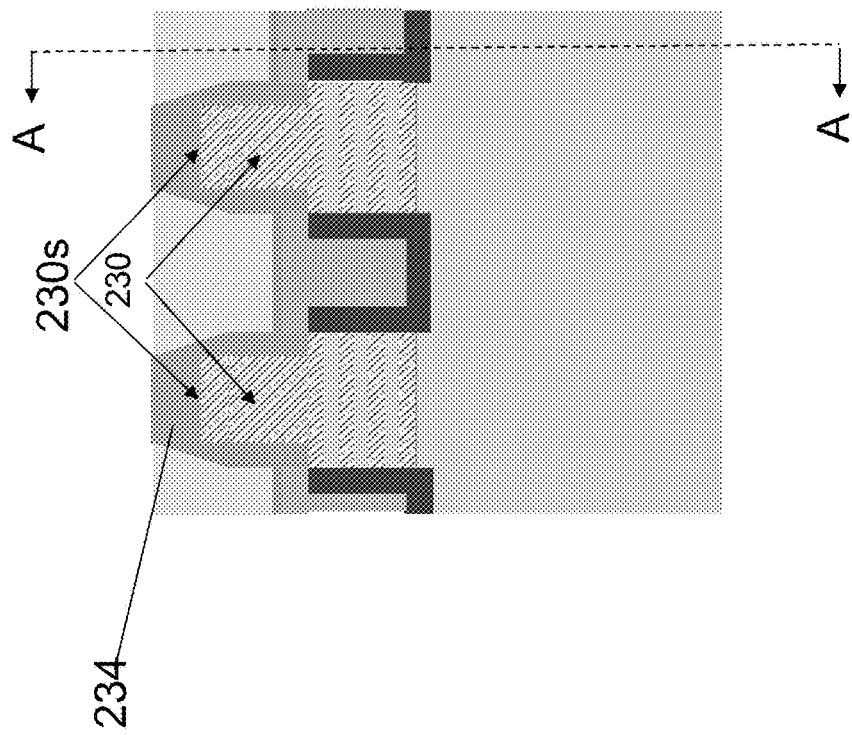
FIG. 12A illustrates a view across the gate structure in the recessing of the gate structure 230 in the semiconductor device 200, according to an exemplary aspect of the present invention.
FIG. 12B illustrates a view of the semiconductor device 200 across the fin structures 212 and along cross section A-A in FIG. 12A, according to an exemplary aspect of the present invention.

FIG. 12A illustrates a view across the gate structure in the recessing of the gate structure 230 in the semiconductor device 200, according to an exemplary aspect of the present invention. FIG. 12B illustrates a view of the semiconductor device 200 across the fin structures 212 and along cross section A-A in FIG. 12A, according to an exemplary aspect of the present invention.

As illustrated in FIG. 12A, the gate structure 230 may be etched in order to recess the upper surface 230s of the gate structure 230 to be below the upper surface of the oxide layer 228. A sacrificial cap 234 (e.g., silicon nitride) may then be formed on the upper surface 230s of the gate structure, so as to fill the recess formed by the etching of the gate structure 230.

Another polishing (e.g., CMP) may be performed so that an upper surface of the sacrificial cap 234 is substantially co-planar with an upper surface of the oxide layer 228.

FIG. 13A illustrates a view across the gate structure in the etching of the oxide layer 228 in the semiconductor device 200, according to an exemplary aspect of the present invention. FIG. 13B illustrates a view of the semiconductor device 200 across the fin structures 212 and along cross section A-A in FIG. 13A, according to an exemplary aspect of the present invention.

As illustrated in FIG. 13A, the etching (e.g., RIE or glass cluster ion beam (GCIB)) may be performed to remove the oxide layer 228 and the POC liner layer 226, and expose an upper surface 224s of the sacrificial layer 224.

Figures 14A, 14B:
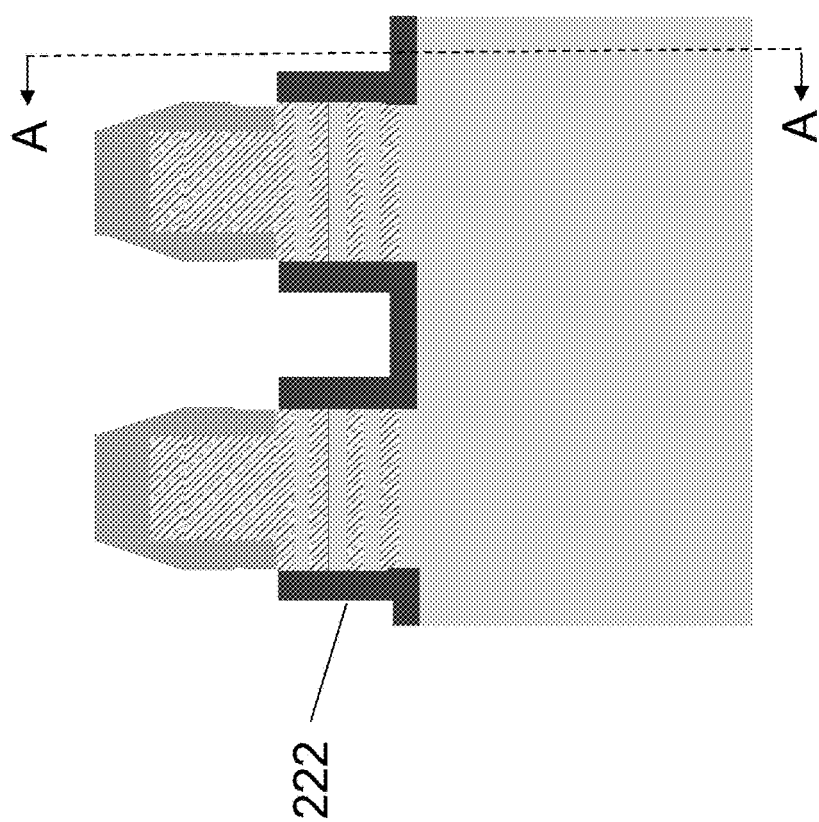
FIG. 14A illustrates a view across the gate structure in the etching of the sacrificial layer 224 (e.g., undoped germanium) in the semiconductor device 200, according to an exemplary aspect of the present invention.
FIG. 14B illustrates a view of the semiconductor device 200 across the fin structures 212 and along cross section A-A in FIG. 14A, according to an exemplary aspect of the present invention.

FIG. 14A illustrates a view across the gate structure in the etching of the sacrificial layer 224 (e.g., undoped germanium) in the semiconductor device 200, according to an exemplary aspect of the present invention. FIG. 14B illustrates a view of the semiconductor device 200 across the fin structures 212 and along cross section A-A in FIG. 14A, according to an exemplary aspect of the present invention.

The sacrificial layer 224 may be removed, for example, by a selective etch using SC1 (ammonium hydroxide and hydrogen peroxide), HCl, etc., until an upper surface of the epitaxial layer 222 is exposed.

Figure 15B:
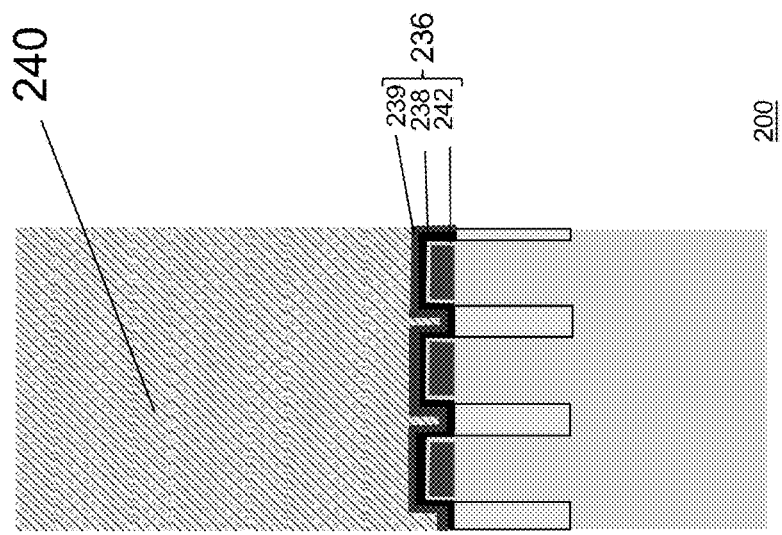
FIG. 15B illustrates a view of the semiconductor device 200 across the fin structures 212 and along cross section A-A in FIG. 15A, according to an exemplary aspect of the present invention.
Figure 15A:
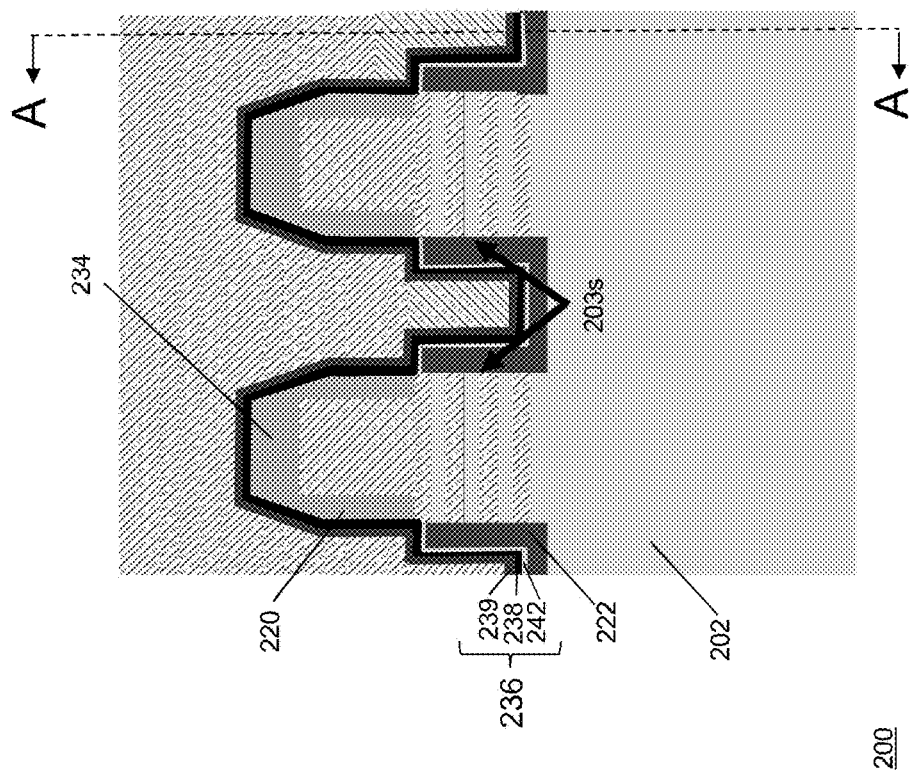
FIG. 15A illustrates a view across the gate structure in the forming of wrap around contact 236 in the semiconductor device 200, according to an exemplary aspect of the present invention.

FIG. 15A illustrates a view across the gate structure in the forming of wrap around contact 236 in the semiconductor device 200, according to an exemplary aspect of the present invention. FIG. 15B illustrates a view of the semiconductor device 200 across the fin structures 212 and along cross section A-A in FIG. 15A, according to an exemplary aspect of the present invention.

The wrap around contact 236 may be formed, for example, by depositing (e.g., by PVD) a metal layer 238 (e.g., titanium) over the semiconductor device 200 (e.g., over the entire device). The metal layer 238 may be conformally formed so as to conform to a surface of the epitaxial layer 222 (e.g., the epitaxial layer on the substrate 202 and on the sidewall 203s of the semiconductor layers 203), a surface of the spacers 220 and a surface of the sacrificial cap 234. After the metal layer 238 has been deposited, an etching may be performed in order to conformally form the metal layer 238.

A barrier layer 239 (e.g., titanium nitride) may be formed (e.g., by atomic layer deposition (ALD)) on the metal layer 238, and another metal layer 240 (e.g., tungsten) may be formed (e.g., deposited by PVD) on the barrier layer 239. The other metal layer 240 may be polished (e.g., by CMP) so that an upper surface of the other metal layer 240 may be substantially co-planar with an upper surface of the sacrificial cap 234.

The semiconductor device 200 may then be heated by a heat treatment (e.g., by laser anneal) in order to react the metal layer 238 (e.g., titanium) with a silicon surface of the epitaxial layer 222, and form a metal silicide layer 242 (e.g., titanium silicide layer) between the epitaxial layer 222 and the metal layer 238.

Second Embodiment

FIG. 16 illustrates a method 1600 of forming a wrap around contact, according to another exemplary aspect of the present invention.

As illustrated in FIG. 16, the method 1600 includes forming (1610) a plurality of semiconductor layers on a plurality of fin structures, forming (1620) a sacrificial gate on the plurality of semiconductor layers, forming (1630) a faceted epitaxial layer on the plurality of fin structures and on a sidewall of the plurality of semiconductor layers, forming (1640) a gate structure by replacing the sacrificial gate and the plurality of semiconductor layers with a metal layer, and forming (1650) a wrap around contact on the faceted epitaxial layer.

Referring again to the drawings, FIGS. 17A-28B illustrate a method of forming a wrap around contact in a semiconductor device 1700, according to another exemplary aspect of the present invention.

In particular, FIG. 17A illustrates a view across the gate structure in the forming of the gate structures 1716, in the semiconductor device 1700, according to an exemplary aspect of the present invention. FIG. 17B illustrates a view of the semiconductor device 1700 across the fin structures 1712 and along cross section A-A in FIG. 17A, according to an exemplary aspect of the present invention.

The fin structures 1712 and gate structures 1716 may be formed in a manner similar to that of fin structures 212 and gate structures 216 described above with reference to FIGS. 2A-6B.

The semiconductor layers 1703 may include first semiconductor layers 1704 and second semiconductor layers 1706. As illustrated in FIGS. 17A-17B, the first semiconductor layers 1704 may be alternately formed with the second semiconductor layers 1706 on the substrate 1702.

The first semiconductor layers 1704 may include, for example, silicon germanium (SiGe), and the second semiconductor layers 1706 may include, for example, silicon, and the substrate 1702 may include, for example, silicon. In particular, the semiconductor layers 1703 may include a nanosheet or a plurality of nanosheets having a thickness in a range from 1 nm to 100 nm.

The first and second semiconductor layers 1704, 1706 may also be formed, for example, by epitaxy. That is, the first and second semiconductor layers 1704, 1706 may be epitaxial layers grown on the substrate 1702. A thickness of the first and second semiconductor layers 1704, 1706 may be substantially the same and may be, for example, in a range from 1 nm to 100 nm.

As illustrated in FIG. 17A, the first semiconductor layer 1704 may be first formed on the surface of the substrate 1702, and may be the uppermost layer of the semiconductor layers 1703. Although seven (7) semiconductor layers 1703 are illustrated in FIGS. 17A-17B, other numbers of semiconductor layers 1703 may be used.

As also illustrated in FIGS. 17A-17B, a hard mask 1708 may be formed on the first and second semiconductor layers 1704, 1706. The hard mask 1708 may include, for example, silicon nitride (SiN) and may be used for patterning of the semiconductor device 1700.

A hard mask may be used to etch the substrate 1702 and the first and second semiconductor layers 1704, 1706 to form the fin structures 1712. It is important again to note that the space between the fin structures 1712 may be small (e.g., less than 30 nm).

The STI region 1714 may be formed, for example, by depositing an oxide. The STI region 1714 may first be formed to have an upper surface which is substantially co-planar with the upper surface of the hard mask 1708 (e.g., by chemical mechanical polishing (CMP)), and then etched (e.g., by diluted HF, buffer HF or COR) to reveal the fin structures 1712. As illustrated in FIG. 17B, the STI regions 1714 may be etched down to the point at which the upper surface of the STI regions 1714 is below the lowermost of the first semiconductor layers 1704a.

A gate insulating layer 1715 (e.g., gate oxide layer, such as silicon oxide, or high-k material) may be formed on the uppermost of the first and second semiconductor layers 1704, 1706, the sacrificial gate 1716 may be formed on the gate insulating layer 1715, and a mask 1718 may be formed on the sacrificial gate 1716.

The sacrificial gate 1716 may be formed, for example, of polysilicon. The mask 1718 may include, for example, a silicon nitride layer 1718a formed on the sacrificial gate 1716, and an oxide layer 1718b (e.g., silicon oxide) formed on the silicon nitride layer 1718a. The gate insulating layer 1715, the sacrificial gate 1716 and the mask 1718 may all be formed by deposition (e.g., physical vapor deposition (PVD), chemical vapor deposition (CVD), etc.)

The mask 1718 may then be patterned, and then used to etch (e.g., pattern) the sacrificial gate 1716 and the gate insulating layer 1715, as illustrated in FIG. 17A. The etching may be performed, for example, by reactive ion etching (RIE).

Figure 18A:
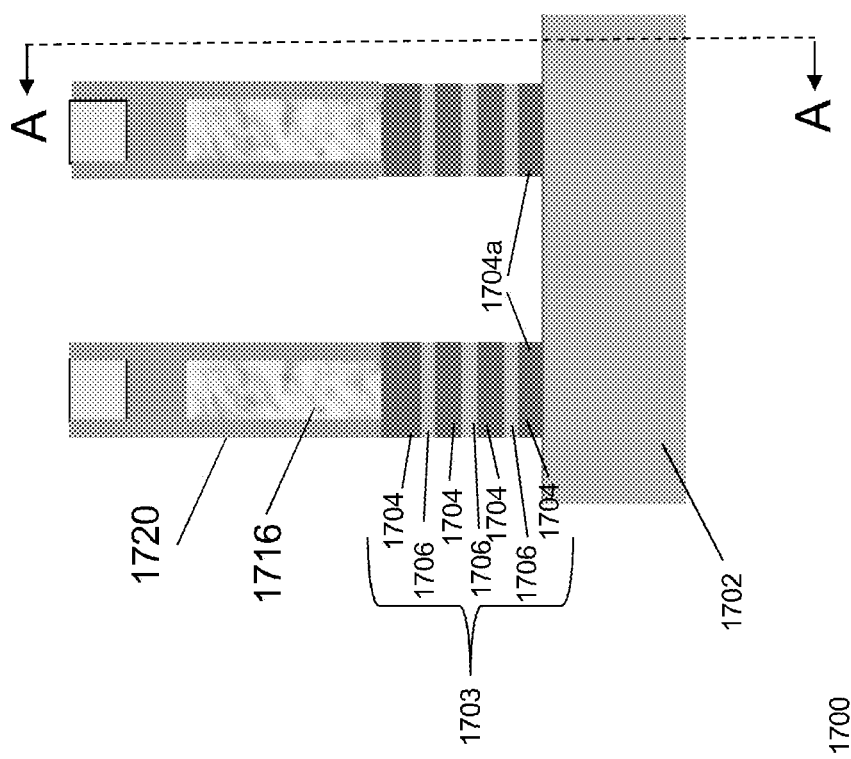
FIG. 18A illustrates a view across the gate structure in the forming of spacers 1720 on the sacrificial gate 216 in the semiconductor device 1700, according to an exemplary aspect of the present invention.
Figure 18B:
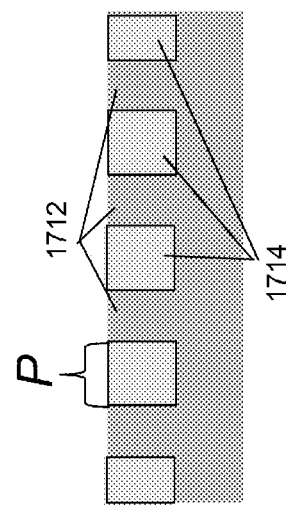
FIG. 18B illustrates a view of the semiconductor device 1700 across the fin structures 1712 and along cross section A-A in FIG. 18A, according to an exemplary aspect of the present invention.

FIG. 18A illustrates a view across the gate structure in the forming of spacers 1720 on the sacrificial gate 216 in the semiconductor device 1700, according to an exemplary aspect of the present invention. FIG. 18B illustrates a view of the semiconductor device 1700 across the fin structures 1712 and along cross section A-A in FIG. 18A, according to an exemplary aspect of the present invention.

The spacers 1720 may be formed, for example, by depositing a silicon nitride layer on the device 1700 (e.g., over the entire surface of the device 1700), and then etching the silicon nitride layer using RIE (e.g., a directional etch) to form the spacers 1720. Unlike the spacers 220 in FIG. 7A, the spacers 1720 are not necessarily formed so as to be tapered.

As further illustrated in FIGS. 18A-18B, the etching may also remove a portion of the semiconductor layers 1703 on the fin structures 1712 and near the sacrificial gate 1716. The semiconductor layers 1703 may be etched down to the point at which the upper surface of the substrate 1702 near the sacrificial gate 1716 is below the lowermost of the first semiconductor layers 1704$a$.

As illustrated in FIG. 18B, the etching may be performed so that an upper surface of the fin structures 1712 is substantially co-planar with an upper surface of the STI regions 1714. Again, the space between the fin structures 1712 may less than 30 nm.

Figures 19A, 19B:
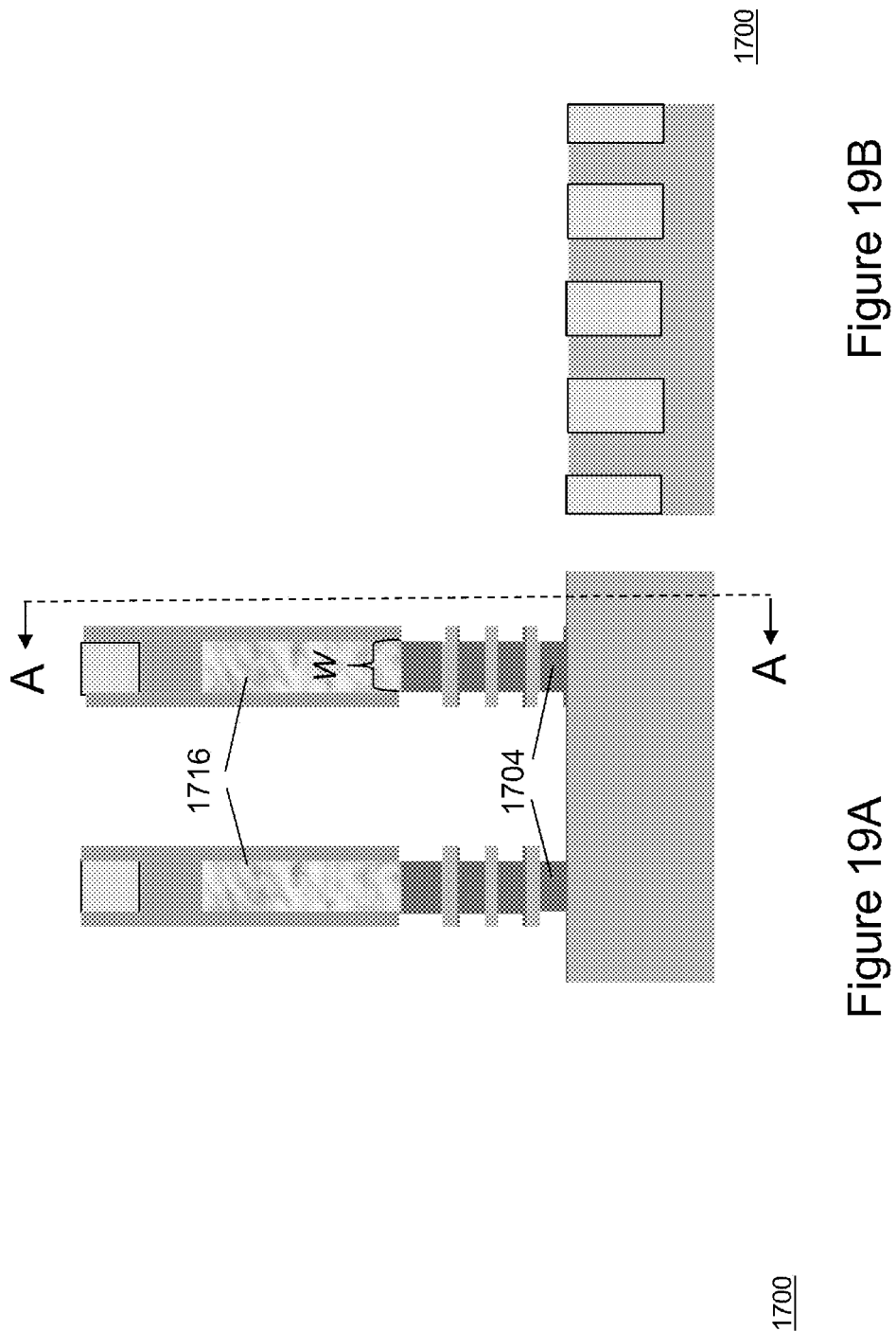
FIG. 19A illustrates a view across the gate structure in the indenting of the first semiconductor layers 1704 (e.g., silicon germanium layers) in the semiconductor device 1700, according to an exemplary aspect of the present invention.
FIG. 19B illustrates a view of the semiconductor device 1700 across the fin structures 1712 and along cross section A-A in FIG. 19A, according to an exemplary aspect of the present invention.

FIG. 19A illustrates a view across the gate structure in the indenting of the first semiconductor layers 1704 (e.g., silicon germanium layers) in the semiconductor device 1700, according to an exemplary aspect of the present invention. FIG. 19B illustrates a view of the semiconductor device 1700 across the fin structures 1712 and along cross section A-A in FIG. 19A, according to an exemplary aspect of the present invention.

As illustrated in FIG. 19A, the first semiconductors layers 1704 (e.g., silicon germanium) may be etched so as to be indented from the second semiconductor layers 1706 (e.g., silicon). This may be accomplished by etching by using SC1 (e.g., ammonium hydroxide and hydrogen peroxide), HCl, etc.

As further illustrated in FIG. 19A, the amount of indent may be in a range from 5 nm to 10 nm, a length of the second semiconductor layer 1706 extending past the side wall of the first semiconductor layer 1706 being equal to the amount of indent. That is, the amount of indent may be substantially the same to a thickness of the spacer 1720, so that a width W of the remaining portion (e.g., central portion) of the first semiconductor layers 1704 is in a range from 5 nm to 500 nm, and substantially equal to a width of the sacrificial gate 1716.

Figures 20A, 20B:
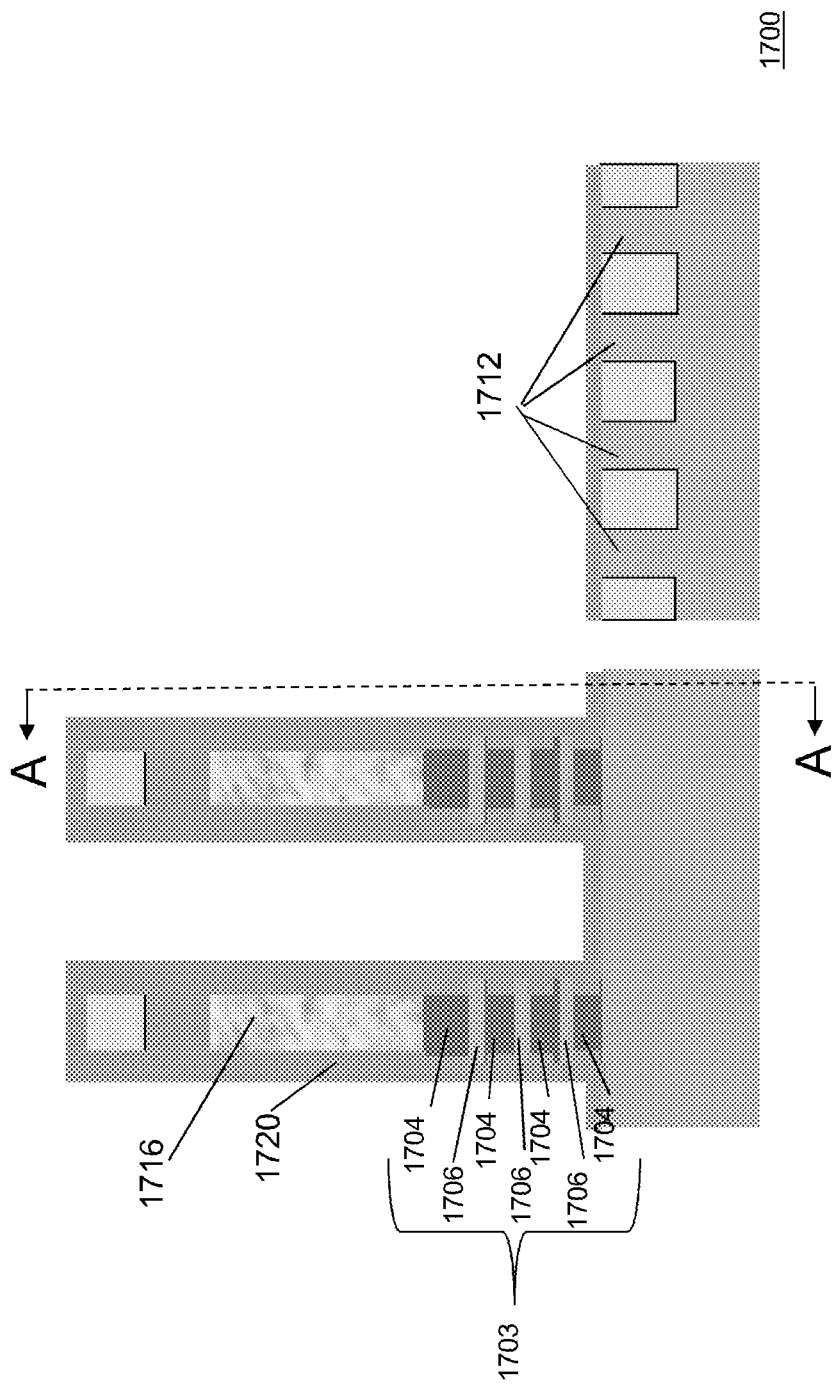
FIG. 20A illustrates a view across the gate structure in the forming of the spacers 1720, in the semiconductor device 1700, according to an exemplary aspect of the present invention.
FIG. 20B illustrates a view of the semiconductor device 1700 across the fin structures 1712 and along cross section A-A in FIG. 20A, according to an exemplary aspect of the present invention.

FIG. 20A illustrates a view across the gate structure in the forming of the spacers 1720, in the semiconductor device 1700, according to an exemplary aspect of the present invention. FIG. 20B illustrates a view of the semiconductor device 1700 across the fin structures 1712 and along cross section A-A in FIG. 20A, according to an exemplary aspect of the present invention.

As illustrated in FIG. 20A, the spacers 1720 may be further developed by depositing (e.g., using ALD, PVD, CVD, etc.) additional insulating material such as silicon nitride or other low-k material (e.g., the same material used in originally forming the spacers 1720 in FIG. 17A). The spacers 1720 may be formed so as to cover the portion of the second semiconductor layers 1706 which extends beyond the side wall of the first semiconductor layers 1704.

FIG. 21A illustrates a view across the gate structure in etching of the etching of the spacer 1720, in the semiconductor device 1700, according to an exemplary aspect of the present invention. FIG. 21B illustrates a view of the semiconductor device 1700 across the fin structures 1712 and along cross section A-A in FIG. 21A, according to an exemplary aspect of the present invention.

The spacers 1720 may be "pulled back" by etching (e.g., using RIE or WET chemistry such as H3PO4) so that a thickness of the spacers 1720 is reduced, and a side wall 1720$s$ of the spacer 1720 is substantially aligned with a side wall 1706$s$ of the second semiconductor layer 1706. That is, the spacer 1720 remains in the "cavity" formed by the indenting of the first semiconductor layers 1704.

As illustrated in FIG. 21B, the etching may also remove the spacer material from the surface of the fin structures 1712 and the STI regions 1714.

FIG. 22A illustrates a view across the gate structure in the forming of the faceted epitaxial layer 1722 in the semiconductor device 1700, according to an exemplary aspect of the present invention. FIG. 22B illustrates a view of the semiconductor device 1700 across the fin structures 1712 and along cross section A-A in FIG. 22A, according to an exemplary aspect of the present invention.

The faceted epitaxial layer 1722 may be grown on the exposed silicon surfaces of the semiconductor device 1700 so that facets 1722$f$ (e.g., (111) facets) are formed. In particular, the facets 1722$f$ may be formed on the side wall 1706$s$ of the second semiconductor layers 1706, and on the fins 1712.

A thickness of the faceted epitaxial layer 1722 may be in a range from 5 nm to 10 nm. That is, a greatest thickness of the facet 1722$f$ of the faceted epitaxial layer 1722 may be in a range from 5 nm to 10 nm. As illustrated in FIG. 22A, the facets 1722$f$ may grow laterally onto a side wall 1720$s$ of the spacer 1720 (e.g., over an interface between the second semiconductor layer 1706 and the spacer 1720), and onto an upper surface of the STI regions 1714.

The faceted epitaxial layer 1722 may include, for example, a doped epitaxial layer. For example, where the epitaxial layer 1722 is silicon carbide, the dopant may include phosphorus, where the epitaxial layer is silicon germanium, the dopant may include boron, and so on. The epitaxial layer 1722 may form a junction between the source and drain regions and the channel of the semiconductor device 1700.

It is important to note that the forming of epitaxial layer 1722 is done so as to avoid a merging of the epitaxial layer 1722, and so as to allow room for a wrap around contact to be formed on the epitaxial layer 1722. For example, as illustrated in FIGS. 22A-22B, a distance $d_1$ between the epitaxial layer 1722 formed on the side walls 1706$s$ of the second semiconductor layers 1706, and a distance $d_2$ between the faceted epitaxial layer 1722 formed on the fin structures 1712, should each be at least 5 nm.

Further, a sacrificial layer 1724 may be formed (e.g., grown in situ, deposited by PVD, CVD, etc.) on the faceted epitaxial layer 1722. The sacrificial layer 1724 may include, for example, germanium (e.g., undoped, pure germanium) or silicon germanium with a high germanium content (e.g., high % Ge). A height of the upper surface of the sacrificial layer 1724 may be greater than a height of the upper surface of the epitaxial layer 1722 formed on the sidewall 1703s of the semiconductor layers 1703.

Figures 23A, 23B:
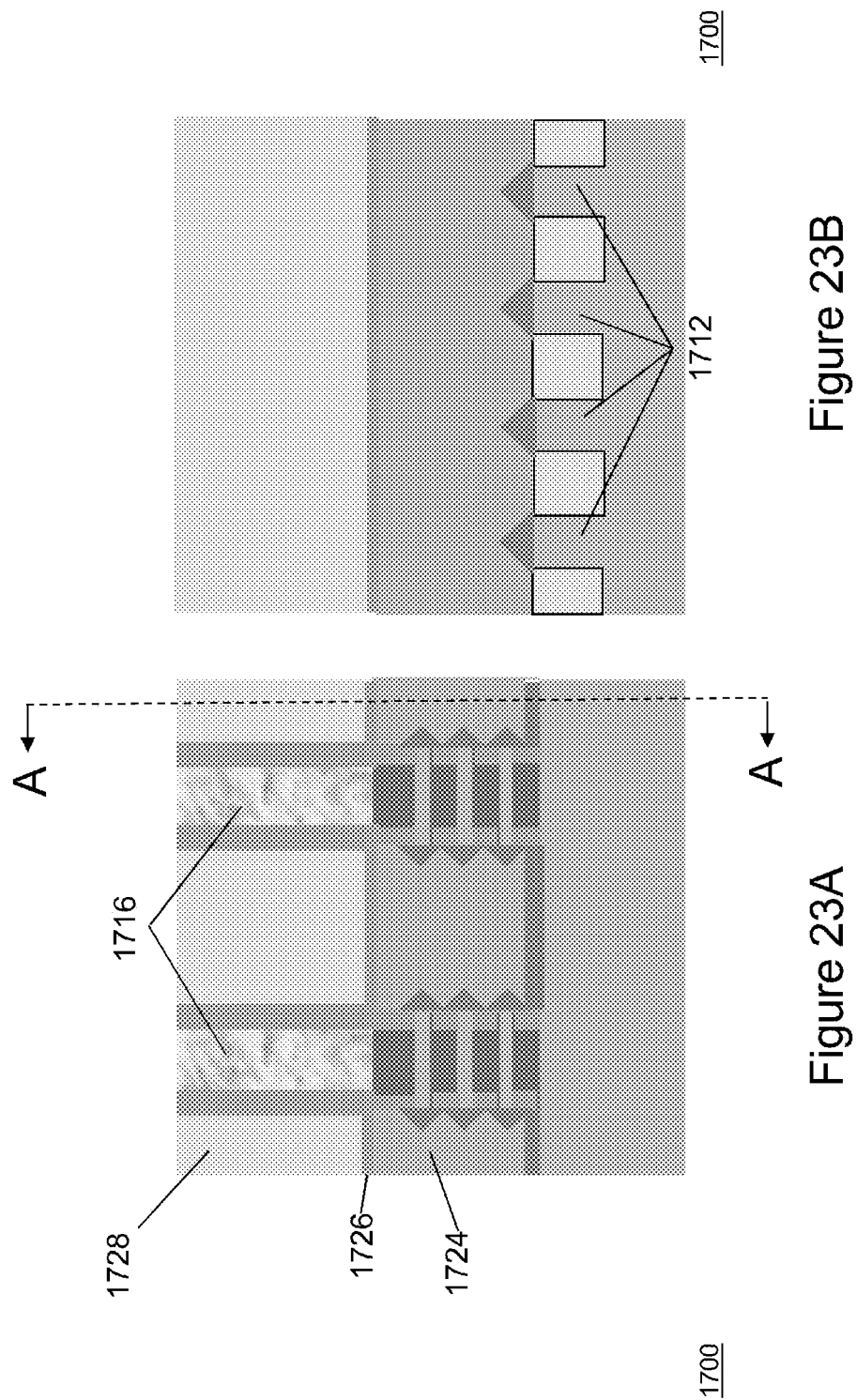
FIG. 23A illustrates a view across the gate structure in the forming of the POC liner layer 1726 and oxide layer 1728 in the semiconductor device 1700, according to an exemplary aspect of the present invention.
FIG. 23B illustrates a view of the semiconductor device 1700 across the fin structures 1712 and along cross section A-A in FIG. 23A, according to an exemplary aspect of the present invention.

FIG. 23A illustrates a view across the gate structure in the forming of the POC liner layer 1726 and oxide layer 1728 in the semiconductor device 1700, according to an exemplary aspect of the present invention. FIG. 23B illustrates a view of the semiconductor device 1700 across the fin structures 1712 and along cross section A-A in FIG. 23A, according to an exemplary aspect of the present invention.

As illustrated in FIGS. 23A-23B, a POC liner layer 1726 may be formed (e.g., deposited by PVD, CVD, etc.) on the sacrificial layer 1724, and an oxide layer 1728 (e.g., TS oxide) may be formed (e.g., deposited by PVD, CVD, etc.) on the POC liner layer 1726. The POC liner layer 1726 may be, for example, silicon nitride or other low-k material.

After the oxide layer 1728 is formed, CMP may be performed until an upper surface of the sacrificial gate 1716 (e.g., upper surface of the polysilicon) is exposed.

FIG. 24A illustrates a view across the gate structure in the etching of the sacrificial gate 1716 in the semiconductor device 1700, according to an exemplary aspect of the present invention. FIG. 24B illustrates a view of the semiconductor device 1700 across the fin structures 1712 and along cross section A-A in FIG. 24A, according to an exemplary aspect of the present invention.

As illustrated in FIG. 24A, an etching (e.g., selective etching) may be performed in order to remove the sacrificial gate 1716 (polysilicon), so that a void $V_1$ is formed, and to remove the remaining portion (e.g., central portion) of the first semiconductor layers 204 (e.g., silicon germanium) so that a void $V_2$ (e.g., a plurality of voids $V_2$) is formed.

The gate oxide 1715 is not clearly shown in FIGS. 24A-28A, since the gate oxide 1715 is gone at this point, having been removed after sacrificial etch of the poly 1716 and before the sacrificial etching of semiconductor layers 1704.

Figures 25A, 25B:
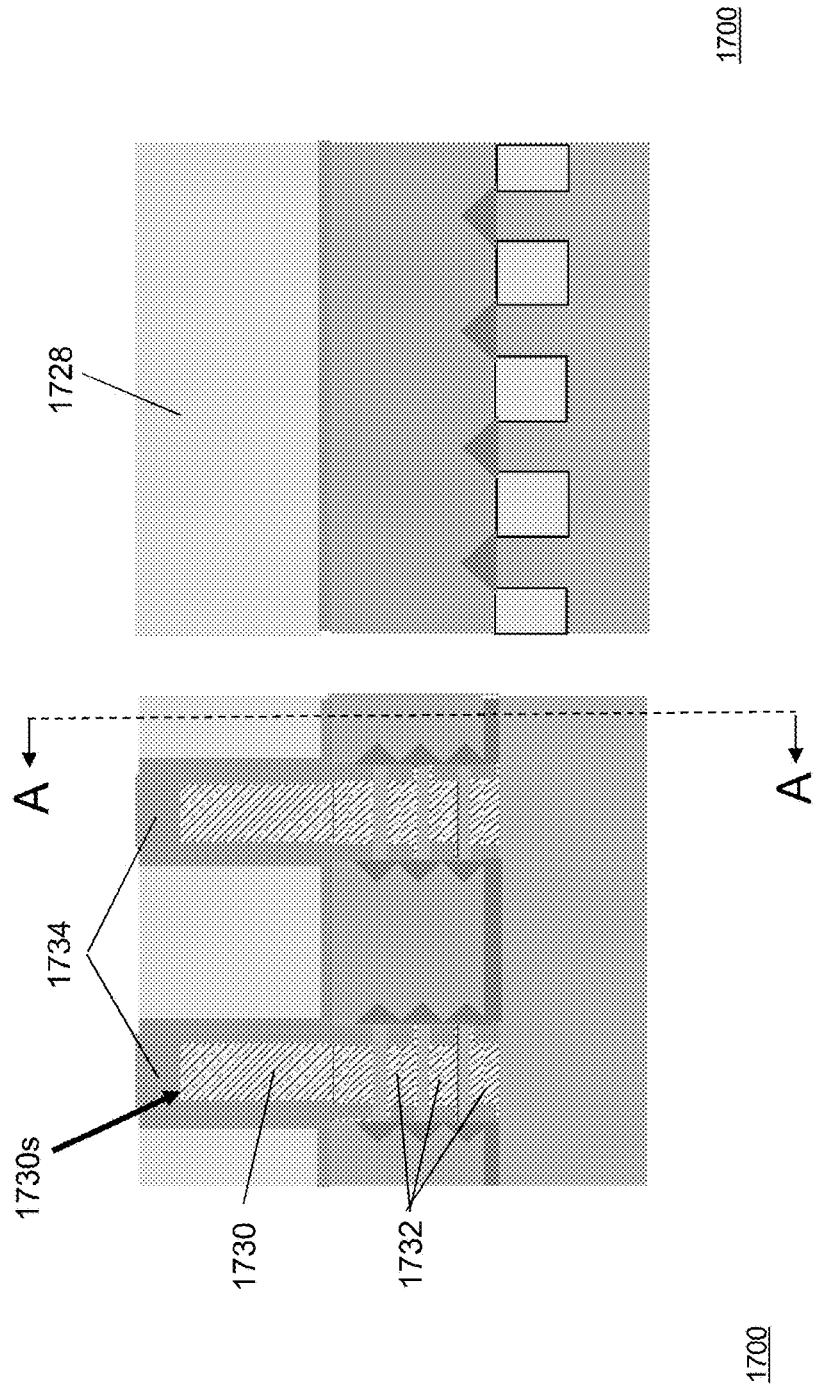
FIG. 25A illustrates a view across the gate structure in the forming of the gate structure 1730 (e.g., plurality of gate structures) in the semiconductor device 1700, according to an exemplary aspect of the present invention.
FIG. 25B illustrates a view of the semiconductor device 1700 across the fin structures 1712 and along cross section A-A in FIG. 25A, according to an exemplary aspect of the present invention.

FIG. 25A illustrates a view across the gate structure in the forming of the gate structure 1730 (e.g., plurality of gate structures) in the semiconductor device 1700, according to an exemplary aspect of the present invention. FIG. 25B illustrates a view of the semiconductor device 1700 across the fin structures 1712 and along cross section A-A in FIG. 25A, according to an exemplary aspect of the present invention.

As illustrated in FIG. 25A, a first metal is deposited on the semiconductor device 1700 so as to fill the voids V2, so that layers 1732 of the conductive material is formed between the second semiconductor layers 1706. A second conductive material (e.g., metal such as tungsten, cobalt, or an alloy including tungsten or cobalt) may be deposited (e.g., PVD) on the semiconductor device 1700 so as to completely fill the void $V_1$ (e.g., to fill the gate stack) to form the gate structure 1730 (e.g., replacement metal gate (RMG)). The gate structure 1730 may be etched in order to recess the upper surface 1730s of the gate structure 1730 to be below the upper surface of the oxide layer 1728. A sacrificial cap 1734 (e.g., silicon nitride) may then be formed on the upper surface 1730s of the gate structure 1730, so as to fill the recess formed by the etching of the gate structure 1730.

Another polishing (e.g., CMP) may be performed so that an upper surface of the sacrificial cap 1734 is substantially co-planar with an upper surface of the oxide layer 1728.

FIG. 26A illustrates a view across the gate structure in the removal of the oxide layer 1728 in the semiconductor device 1700, according to an exemplary aspect of the present invention. FIG. 26B illustrates a view of the semiconductor device 1700 across the fin structures 1712 and along cross section A-A in FIG. 26A, according to an exemplary aspect of the present invention.

As illustrated in FIG. 26A, the etching (e.g., RIE or glass cluster ion beam (GCIB)) may be performed to remove the oxide layer 1728. The etching may stop at the POC liner layer 1726.

FIG. 27A illustrates a view across the gate structure in the removal of the POC liner layer 1726 and sacrificial layer 1724 in the semiconductor device 1700, according to an exemplary aspect of the present invention. FIG. 27B illustrates a view of the semiconductor device 1700 across the fin structures 1712 and along cross section A-A in FIG. 27A, according to an exemplary aspect of the present invention.

The POC liner layer 1726 may be removed, for example, by etching, and the sacrificial layer 1724 may be removed, for example, by a selective etch using SC1 (ammonium hydroxide and hydrogen peroxide), HCl, etc., until an upper surface of the faceted epitaxial layer 1722 is exposed.

Figures 28A, 28B:
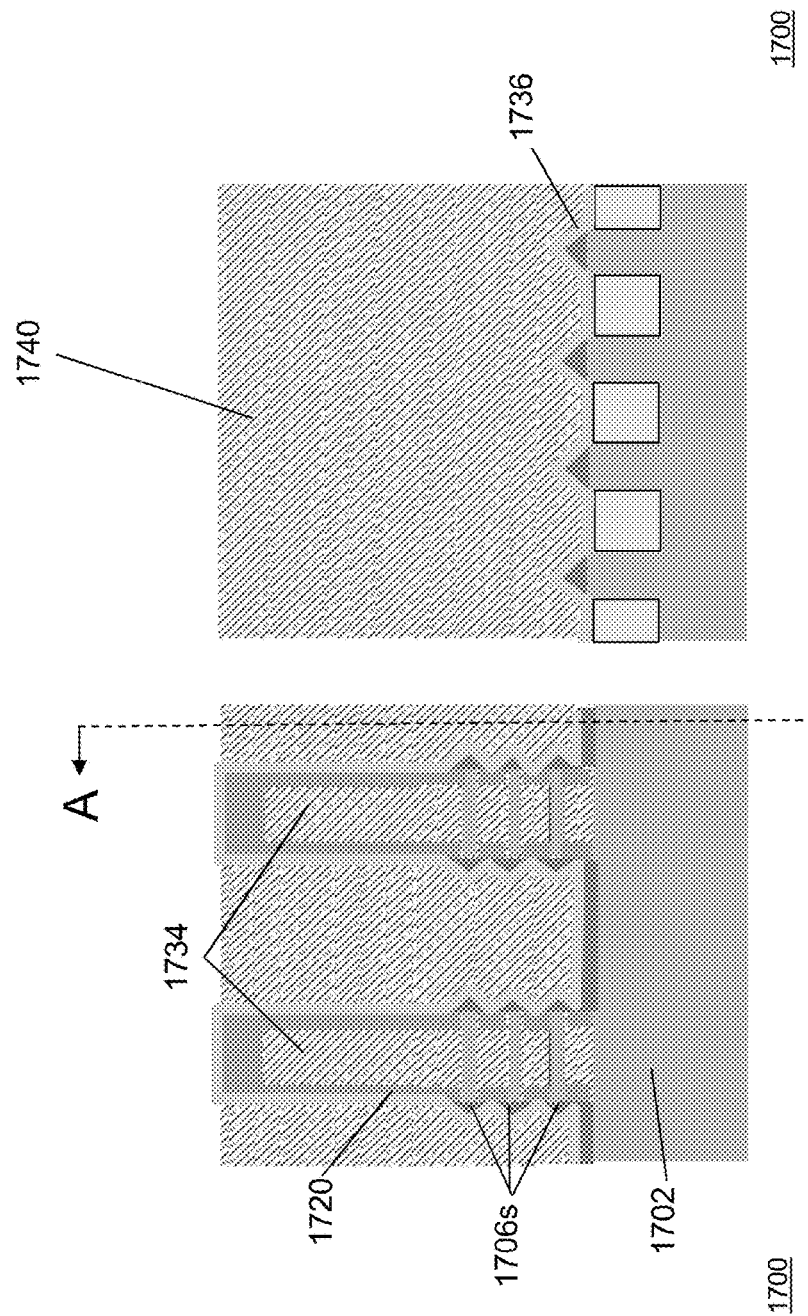
FIG. 28A illustrates a view across the gate structure in the forming of a wrap around contact 1736 in the semiconductor device 1700, according to an exemplary aspect of the present invention.
FIG. 28B illustrates a view of the semiconductor device 1700 across the fin structures 1712 and along cross section A-A in FIG. 28A, according to an exemplary aspect of the present invention.

FIG. 28A illustrates a view across the gate structure in the forming of a wrap around contact 1736 in the semiconductor device 1700, according to an exemplary aspect of the present invention. FIG. 28B illustrates a view of the semiconductor device 1700 across the fin structures 1712 and along cross section A-A in FIG. 28A, according to an exemplary aspect of the present invention.

The wrap around contact 1736 may be formed in a manner similar to the forming of the wrap around contact 236 described above. For example, a metal layer (e.g., titanium) may be deposited (e.g., by PVD) over the semiconductor device 1700 (e.g., over the entire device). The metal layer may be conformally formed so as to conform to a surface of the faceted epitaxial layer 1722 (e.g., the faceted epitaxial layer 1722 on the substrate 1702, on the side wall 1706s of the second semiconductor layers 1706, and on the fin structures 1712), a surface of the spacers 1720 and a surface of the sacrificial cap 1734. After the metal layer has been deposited, an etching may be performed in order to conformally form the metal layer. A barrier layer (e.g., titanium nitride) may be formed (e.g., by atomic layer deposition (ALD)) on the metal layer.

Another metal layer 1740 (e.g., tungsten) may be formed (e.g., deposited by PVD) on the wrap around contact 1736 (e.g., on the barrier layer of the wrap around contact 1736). The other metal layer 1740 may be polished (e.g., by CMP) so that an upper surface of the other metal layer 1740 may be substantially co-planar with an upper surface of the sacrificial cap 1734.

The semiconductor device 1700 may then be heated by a heat treatment (e.g., by laser anneal) in order to react the metal layer (e.g., titanium) of the wrap around contact 1736 with a silicon surface of the faceted epitaxial layer 1722, and form a metal silicide layer (e.g., titanium silicide layer) between the faceted epitaxial layer 1722 and the metal layer of the wrap around contact 1736.

With its unique and novel features, the present invention provides semiconductor device including a wrap around contact which may have an improved contact resistance over conventional devices.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A method of forming a wrap around contact, comprising:
forming a plurality of semiconductor layers on a plurality of fin structures;
forming a shallow trench isolation (STI) region between the plurality of fin structures, an upper surface of the STI region being coplanar with an upper surface of the plurality of fin structures;
forming a sacrificial gate on the plurality of semiconductor layers;
forming an epitaxial layer on the upper surface of the plurality of fin structures and on a sidewall of the plurality of semiconductor layers;
forming a gate structure by replacing the sacrificial gate and the plurality of semiconductor layers with a metal layer; and
forming a wrap around contact including a metal silicide layer on a surface of the epitaxial layer.

2. The method of claim 1, wherein the STI region comprises a plurality of shallow trench isolation (STI) regions formed between the plurality of fin structures, the wrap around contact being formed on the STI regions.

3. The method of claim 1, wherein the forming of the gate structure comprises forming a plurality of gate structures.

4. The method of claim 3, wherein the gate structure comprises a spacer formed on a side of the metal layer, and the forming of the wrap around contact comprises forming the wrap around contact on the spacer and on the epitaxial layer between the plurality of gate structures.

5. A method of forming a wrap around contact, comprising:
forming a plurality of semiconductor layers on a plurality of fin structures;
forming a sacrificial gate on the plurality of semiconductor layers;
forming an epitaxial layer on the plurality of fin structures and on a sidewall of the plurality of semiconductor layers;
forming a gate structure by replacing the sacrificial gate and the plurality of semiconductor layers with a metal layer; and
forming a wrap around contact on the epitaxial layer;
wherein the forming of the wrap around contact comprises:
forming a conformal metal liner layer; and
forming a barrier layer on the metal liner layer.

6. The method of claim 5, wherein the forming of the wrap around contact comprises:
annealing the metal liner layer to form the metal silicide layer, the wrap around contact comprising the metal silicide layer and the barrier layer.

7. The method of claim 6, further comprising:
forming a metal fill layer on the barrier layer.

8. The method of claim 1, wherein the forming of the epitaxial layer comprises forming a conformal highly-doped epitaxial film.

9. A method of forming a wrap around contact, comprising:
forming a plurality of semiconductor layers on a plurality of fin structures;
forming a sacrificial gate on the plurality of semiconductor layers;
forming an epitaxial layer on the plurality of fin structures and on a sidewall of the plurality of semiconductor layers;
forming a gate structure by replacing the sacrificial gate and the plurality of semiconductor layers with a metal layer;
forming a wrap around contact on the epitaxial layer;
forming a sacrificial layer to on the epitaxial layer;
forming a liner layer on the sacrificial layer;
forming an oxide layer on the liner layer; and
polishing the oxide layer.

10. The method of claim 9, wherein the sacrificial layer comprises germanium, the liner layer comprises silicon nitride and the oxide layer comprises titania-silica oxide.

11. The method of claim 1, further comprising:
forming a plurality of other semiconductor layers alternately with the plurality of semiconductor layers.

12. The method of claim 11, wherein the replacing of the semiconductor layers comprises:
performing an etching to remove the sacrificial gate and remove the semiconductor layers from between the other semiconductor layers.

13. A method of forming a wrap around contact, comprising:
forming a plurality of semiconductor layers on a plurality of fin structures;
forming a shallow trench isolation (STI) region between the plurality of fin structures, an upper surface of the STI region being coplanar with an upper surface of the plurality of fin structures;
forming a sacrificial gate on the plurality of semiconductor layers;
forming a faceted epitaxial layer on the upper surface of the plurality of fin structures and on a sidewall of the plurality of semiconductor layers;
forming a gate structure by replacing the sacrificial gate and the plurality of semiconductor layers with a metal layer; and
forming a wrap around contact including a metal silicide layer on a surface of the faceted epitaxial layer.

14. The method of claim 13, wherein the STI region comprises a plurality of shallow trench isolation (STI) regions between the plurality of fin structures, the wrap around contact being formed on the STI regions.

15. The method of claim 13, wherein the forming of the gate structure comprises forming a plurality of gate structures,
wherein the gate structure comprises a spacer formed on a side of the metal layer, and
wherein the forming of the wrap around contact comprises forming the wrap around contact on the spacer and on the faceted epitaxial layer between the plurality of gate structures.

16. The method of claim 13, wherein the forming of the wrap around contact comprises:
forming a conformal metal liner layer;
forming a barrier layer on the metal liner layer; and
annealing the metal liner layer to form the metal silicide layer, the wrap around contact comprising the metal silicide layer and the barrier layer.

17. The method of claim 16, further comprising:
forming a metal fill layer on the barrier layer.

18. The method of claim 13, wherein the forming of the faceted epitaxial layer comprises forming a conformal highly-doped faceted epitaxial film.

19. The method of claim 13, further comprising:
forming a sacrificial layer on the faceted epitaxial layer;
forming a liner layer on the sacrificial layer;
forming an oxide layer on the liner layer; and
polishing the oxide layer.

20. The method of claim 19, wherein the sacrificial layer comprises germanium, the liner layer comprises silicon nitride and the oxide layer comprises titania-silica oxide.

21. The method of claim 13, further comprising:
forming a plurality of other semiconductor layers alternately with the plurality of semiconductor layers.

22. The method of claim 21, wherein the replacing of the semiconductor layers comprises:
performing an etching to remove the sacrificial gate and remove the semiconductor layers from between the other semiconductor layers.

23. A method of forming a wrap around contact, comprising:
forming a plurality of shallow trench isolation (STI) regions between a plurality of fin structures;
alternately forming a plurality of semiconductor layers and a plurality of other semiconductor layers on the plurality of fin structures;
forming a plurality of sacrificial gates on the plurality of semiconductor layers and the plurality of other semiconductor layers;
forming an conformal highly-doped epitaxial layer on the plurality of fin structures and on a sidewall of the plurality of semiconductor layers and a sidewall of the plurality of other semiconductor layers;
forming a plurality of gate structures by replacing the sacrificial gate and the plurality of semiconductor layers with a metal layer, the gate structure comprising a spacer formed on a side of the metal layer, the replacing of the semiconductor layers comprising performing an etching to remove the sacrificial gate and remove the semiconductor layers from between the other semiconductor layers; and
forming a wrap around contact on the epitaxial layer, the wrap around contact being formed on the STI regions, on the spacer and on the epitaxial layer between the plurality of gate structures, the forming of the wrap around contact comprising:
forming a conformal metal liner layer;
forming a barrier layer on the metal liner layer; and
annealing the metal liner layer to form a metal silicide.

* * * * *